US012628341B2

(12) United States Patent
Choi

(10) Patent No.: US 12,628,341 B2
(45) Date of Patent: May 12, 2026

(54) SEMICONDUCTOR DEVICE INCLUDING CHANNEL LAYERS AND METHOD OF MANUFACTURING THE SEMICONDUCTOR DEVICE

(71) Applicant: SK hynix Inc., Icheon-si (KR)

(72) Inventor: Kang Sik Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 288 days.

(21) Appl. No.: 17/212,740

(22) Filed: Mar. 25, 2021

(65) Prior Publication Data

US 2022/0102372 A1    Mar. 31, 2022

(30) Foreign Application Priority Data

Sep. 29, 2020    (KR) ......................... 10-2020-0126714

(51) Int. Cl.
H10B 43/27      (2023.01)
H10B 41/27      (2023.01)

(52) U.S. Cl.
CPC ............. H10B 43/27 (2023.02); H10B 41/27 (2023.02)

(58) Field of Classification Search
CPC ........ H10B 43/27; H10B 41/27; H10B 43/10; H10B 41/10; H10B 41/35; H10B 43/35; H01L 21/76877; H01L 29/66825; H01L 29/66833; H01L 29/788; H01L 29/792
See application file for complete search history.

(56) References Cited

U.S. PATENT DOCUMENTS

| | | | |
|---|---|---|---|
| 10,236,300 B2 | 3/2019 | Zhang et al. | |
| 11,562,956 B2 * | 1/2023 | Lee ..................... | H01L 25/0657 |
| 2012/0168824 A1 | 7/2012 | Lee | |
| 2016/0204122 A1 * | 7/2016 | Shoji ...................... | H10B 43/50 |
| | | | 257/314 |
| 2019/0267391 A1 | 8/2019 | Imai et al. | |
| 2019/0312050 A1 | 10/2019 | Lai et al. | |
| 2020/0135755 A1 * | 4/2020 | Shin ....................... | H10B 43/27 |
| 2020/0251489 A1 * | 8/2020 | Tsutsumi ............... | H10B 41/35 |

FOREIGN PATENT DOCUMENTS

CN        110828468 A      2/2020

* cited by examiner

*Primary Examiner* — Duy T Nguyen
*Assistant Examiner* — Zhijun Xu
(74) *Attorney, Agent, or Firm* — WILLIAM PARK AND ASSOCIATES LTD.

(57)        ABSTRACT
A semiconductor device including: a stack including first conductive layers and insulating layers that are alternately stacked; second conductive layers disposed on the stack; a separation insulating structure disposed on the stack and configured to insulate the second conductive layers from each other; first channel layers passing through the stack; memory layers enclosing sidewalls of the first channel layers; second channel layers disposed on the stack and passing through the second conductive layers, and each having a width less than a width of the first channel layers; gate insulating layers enclosing sidewalls of the second channel layers; and third channel layers configured to respectively couple the first channel layers with the second channel layers and extending into the second channel layers.

25 Claims, 43 Drawing Sheets

SEMICONDUCTOR DEVICE INCLUDING CHANNEL LAYERS AND METHOD OF MANUFACTURING THE SEMICONDUCTOR DEVICE

CROSS-REFERENCE TO RELATED APPLICATION

The present application claims priority under 35 U.S.C. § 119(a) to Korean patent application number 10-2020-0126714, filed on Sep. 29, 2020, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor device and a method of manufacturing the semiconductor device.

2. Related Art

Recently, as the improvement of integration of a two-dimensional memory element including memory cells formed in a single layer on a substrate is limited, a three-dimensional (3D) memory element including memory cells stacked in a vertical direction on a substrate has been proposed. To improve the operational reliability of such a memory element having a three-dimensional structure, various structures and manufacturing methods have been developed.

SUMMARY

An embodiment of the present disclosure may provide for a semiconductor device may include: a stack including first conductive layers and insulating layers that are alternately stacked; second conductive layers disposed on the stack; a separation insulating structure disposed on the stack and configured to insulate the second conductive layers from each other; first channel layers passing through the stack; memory layers enclosing sidewalls of the first channel layers; second channel layers disposed on the stack and passing through the second conductive layers, and each having a width less than a width of the first channel layers; gate insulating layers enclosing sidewalls of the second channel layers; and third channel layers configured to respectively couple the first channel layers with the second channel layers and extending into the second channel layers.

An embodiment of the present disclosure may provide for a semiconductor device may include: a stack including word lines and insulating layers that are alternately stacked; first channel layers passing through the stack; memory layers enclosing sidewalls of the first channel layers; second channel layers disposed on the stack; gate insulating layers enclosing sidewalls of the second channel layers; third channel layers configured to respectively couple the first channel layers with the second channel layers; select lines each comprising a first portion disposed on the stack, and second portions respectively enclosing the second channel layers and protruding into the stack toward the first channel layers; and a separation insulating structure disposed on the stack and configured to insulate the select lines from each other.

An embodiment of the present disclosure may provide for a method of manufacturing a semiconductor device, may include: forming a stack including first material layers and second material layers that are alternately stacked; forming a sacrificial layer on the stack; forming a separation insulating structure passing through the sacrificial layer and disposed over the first material layers; forming a first opening passing through the sacrificial layer, the separation insulating structure, and the stack; forming a first channel layer in the first opening; forming a sacrificial spacer coupled with the sacrificial layer in the first opening; forming in the sacrificial spacer a second channel layer having a width less than a width of the first channel layer; and forming in the first opening a third channel layer configured to couple the first channel layer with the second channel layer and extend into the second channel layer.

BRIEF DESCRIPTION OF THE DRAWINGS

FIGS. 16A, 16B, 16C, 16D, 16E, 16F, 16G, 16H, and 16I are views illustrating a method of manufacturing the semiconductor device according to an embodiment of the present disclosure.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure are directed to a semiconductor device having a stable structure and improved characteristics, and a method of manufacturing the semiconductor device.

Figure 1:
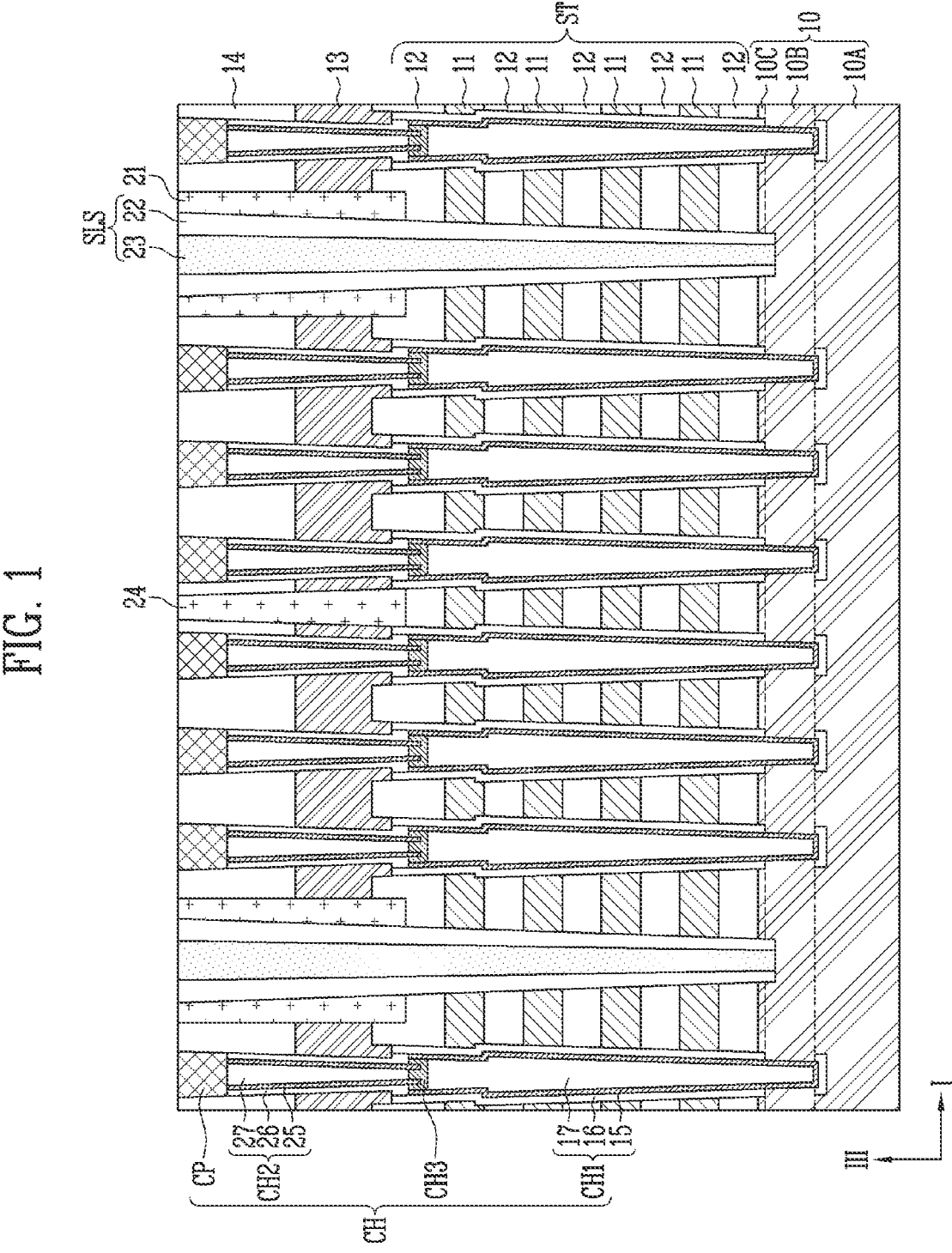
FIG. 1 is a diagram illustrating the structure of a semiconductor device in accordance with an embodiment of the present disclosure.

FIG. 1 is a diagram illustrating the structure of a semiconductor device in accordance with an embodiment of the present disclosure.

Referring to FIG. 1, the semiconductor device may include a stack ST, second conductive layers 13, a separation insulating structure 24, and channel structures CH. The semiconductor device may further include a source structure 10, an insulating layer 14, a protective layer 21, or a slit structure SLS, or may further include a combination thereof.

The stack ST includes first conductive layers 11 and insulating layers 12 which are alternately stacked on top of one another. The first conductive layers 11 each may be a word line or a select line. In an embodiment, at least one lowermost first conductive layer 11 may be a source select line, and the other first conductive layers 11 each may be a word line. The first conductive layers 11 may include conductive material such as polysilicon, tungsten, molybdenum, or metal. The insulating layers 12 may be provided to insulate the stacked first conductive layers 11 from each other, and include insulating material such as oxide, nitride, or air gap. In an embodiment, the lowermost first conductive layer 11 may be located closest to the source structure 10 than the other first conductive layers 11.

The second conductive layers 13 may be disposed on the stack ST. The second conductive layers 13 each may be a word line or a select line. In an embodiment, the second conductive layers 13 each may be a drain select line. The second conductive layers 13 may include conductive material such as polysilicon, tungsten, molybdenum, or metal.

The insulating layers 14 may be disposed on the second conductive layers 13. In a plan view, the insulating layers 14 may have shapes corresponding to that of the second conductive layers 13. The insulating layers 14 may include insulating material such as oxide, nitride, or air gap.

The separation insulating structure 24 may be disposed on the stack ST. The separation insulating structure 24 may insulate the second conductive layers 13 disposed adjacent to each other in a first direction I, from each other. The separation insulating structure 24 may pass through the insulating layer 14 and extend between the second conductive layers 13. The separation insulating structure 24 may extend into the uppermost insulating layer 12 of the stack ST. The separation insulating structure 24 may be disposed at a position spaced apart from the uppermost first conductive layer 11. The separation insulating structure 24 may include insulating material such as oxide, nitride, or air gap. In an embodiment, the uppermost first conductive layer 11 may be located closest to the second conductive layer 13 than the other first conductive layers 11.

The channel structures CH may pass through the stack ST and the second conductive layers 13. The channel structures CH may extend in a third direction III. The third direction III may intersect with the first direction I. In an embodiment, the third direction III may be a direction in which the first conductive layers 11 and the insulating layers 12 are stacked. The channel structures CH may protrude compared to an upper surface of the second conductive layer 13. The channel structures CH may pass through the insulating layers 14.

Each of the channel structures CH may include a first channel structure CH1, a second channel structure CH2, and a third channel structure CH3. Each channel structure CH may further include a contact pad CP. The first channel structure CH1 may pass through the stack ST, and the second channel structure CH2 may pass through the second conductive layer 13. The third channel structure CH3 may couple the corresponding first channel structure CH1 with the corresponding second channel structure CH2.

The first channel structure CH1 may include a first channel layer 15. The first channel structure CH1 may further include a memory layer 16 or a first insulating core 17, or may further include a combination thereof. The first channel layer 15 may include semiconductor material such as silicon (Si), Germanium (Ge), or nano-structure material. The memory layer 16 may be interposed between the first channel layer 15 and the first conductive layers 11. The memory layer 16 may be formed to enclose a sidewall of the first channel layer 15. The first insulating core 17 may be formed in the first channel layer 15. The first insulating core 17 may include insulating material such as oxide, nitride, or air gap.

The second channel structure CH2 may include a second channel layer 25. The second channel structure CH2 may further include a gate insulating layer 26 or a second insulating core 27, or may further include a combination thereof. The second channel layer 25 may include semiconductor material such as silicon (Si), Germanium (Ge), or nano-structure material. The gate insulating layer 26 may be interposed between the second channel layer 25 and the second conductive layers 13. The gate insulating layer 26 may be formed to enclose a sidewall of the second channel layer 25. The gate insulating layer 26 may include insulating material such as oxide, nitride, or air gap. The second insulating core 27 may be formed in the second channel layer 25. The second insulating core 27 may include insulating material such as oxide, nitride, or air gap.

The contact pad CP may be disposed on the second channel structure CH2. The contact pad CP may be coupled to the second channel layer 25. In an embodiment, contact pad CP may be configured to couple the channel structure CH with the bit line. The contact pad CP may include conductive material such as polysilicon, tungsten, molybdenum, or metal.

The source structure 10 may be a single layer or include multiple layers. In an embodiment, the source structure 10 may include a first source layer 10A, a second source layer 10C, and a third source layer 10B. The third source layer 10B may be interposed between the first source layer 10A and the second source layer 10C. The third source layer 10B may pass through the memory layer 16 and be coupled with the first channel layer 15. The first source layer 10A, the second source layer 10C, and the third source layer 10B may include conductive material such as polysilicon, tungsten, molybdenum, or metal The slit structure SLS may pass through the insulating layer 14, the second conductive layer 13, and the stack ST. The slit structure SLS may include a source contact structure 23 and an insulating spacer 22. The source contact structure 23 may be electrically coupled with the source structure 10. The source contact structure 23 may include a single layer or multiple layers. The source contact structure 23 may include conductive material such as polysilicon, tungsten, molybdenum, or metal. The insulating spacer 22 may be interposed between the source contact structure 23 and the second conductive layer 13. In an embodiment, the insulating spacer 22 may be formed to enclose a sidewall of the source contact structure 23. The insulating spacer 22 may include insulating material such as oxide, nitride, or air gap.

The protective layer 21 may be configured to protect the second conductive layers 13 and cover sidewalls of the second conductive layers 13. The protective layer 21 may be interposed between the slit structure SLS and the second conductive layer 13. The protective layer 21 may include insulating material such as oxide, nitride, or air gap.

In accordance with the structure described above, memory cells may be disposed on an area in which the channel structures CH and the first conductive layers 11 intersect with each other. Select transistors may be disposed on an area in which the channel structures CH and the second conductive layers 13 intersect with each other. Memory cells and select transistors that share each channel structure CH may form a single memory string. As such, the degree of integration of the semiconductor device may be increased by stacking memory cells.

Figure 2A:
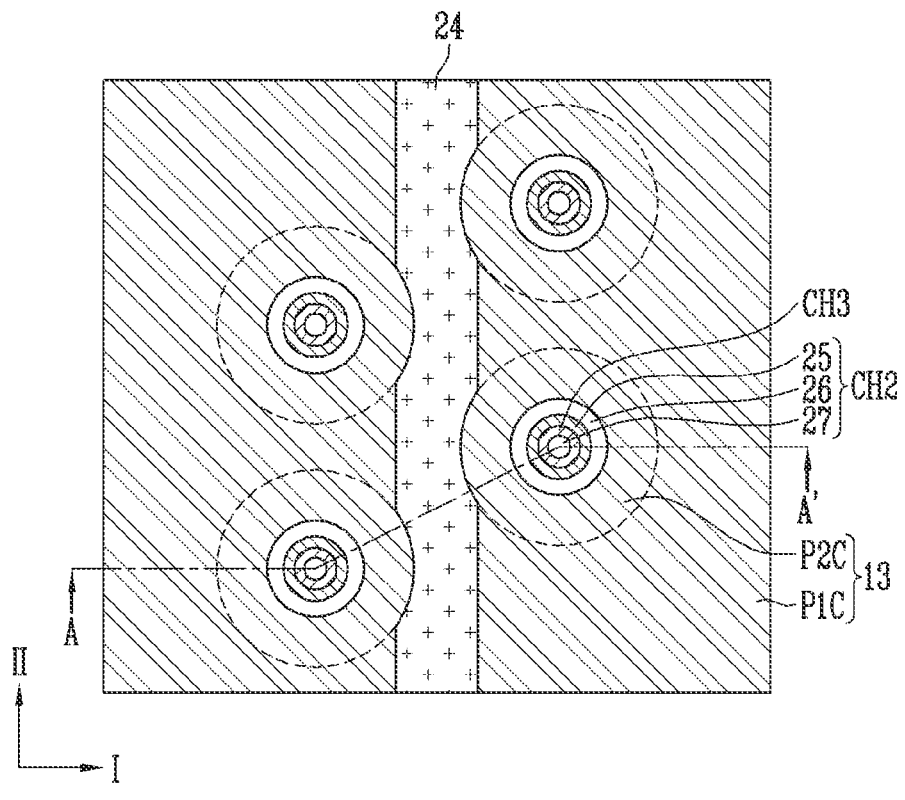
FIGS. 2A, 2B, and 2C are diagrams illustrating the structure of a semiconductor device in accordance with an embodiment of the present disclosure.
Figure 2B:
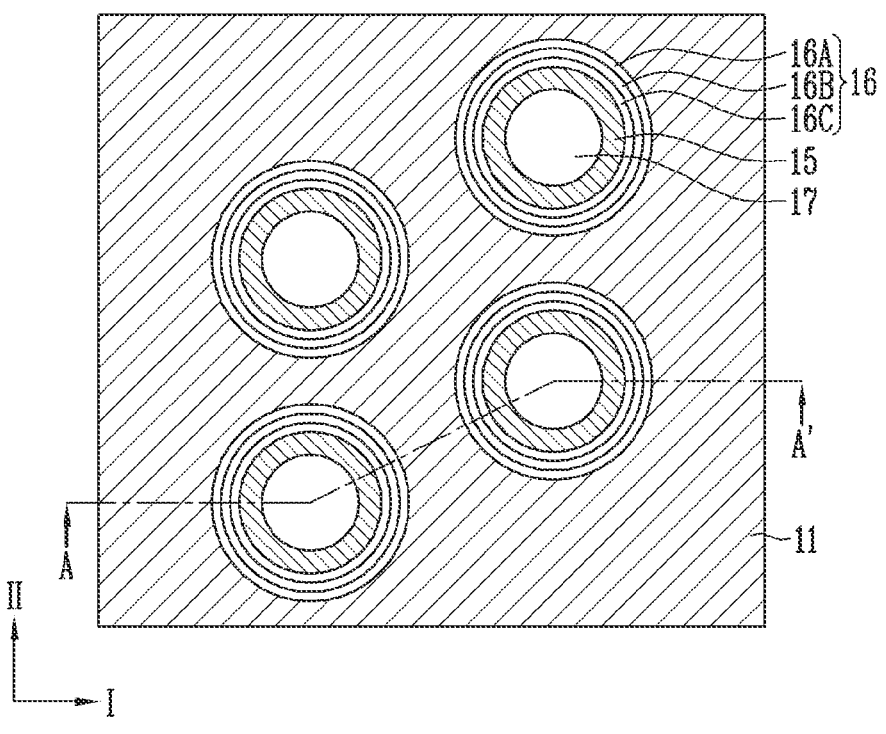
Figure 2C:
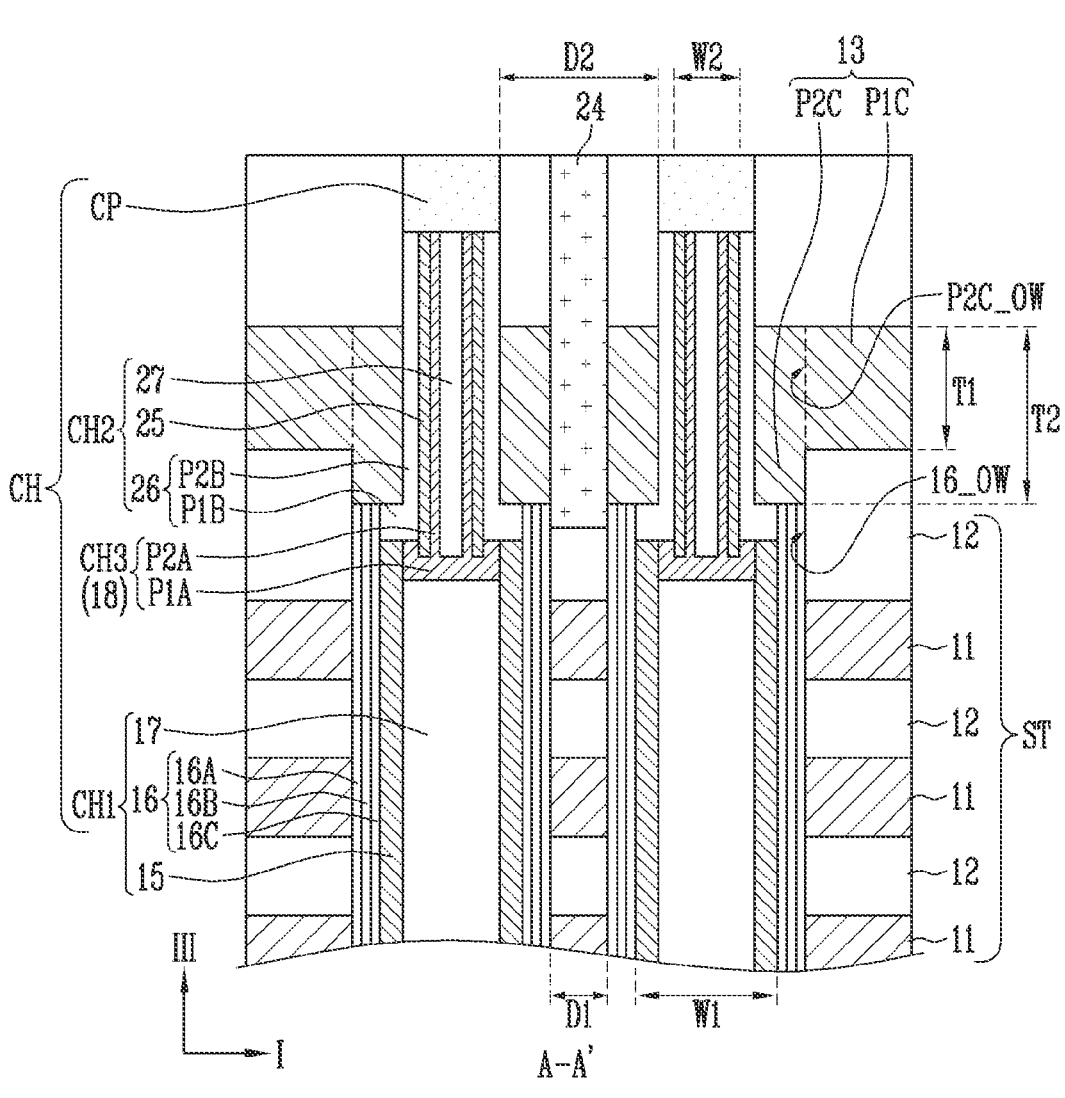

FIGS. 2A to 2C are diagrams illustrating the structure of a semiconductor device in accordance with an embodiment of the present disclosure. FIGS. 2A and 2B may be plan views, and FIG. 2C may be a sectional view taken along line A-A' of FIGS. 2A and 2B. Hereinbelow, repetitive explanation will be omitted if deemed redundant.

Referring to FIGS. 2A to 2C, the channel structures CH may be arranged in the first direction I and a second direction II intersecting with the first direction I. The channel structures CH may be arranged in a matrix type, or a staggered type in which centers thereof are misaligned with each other.

The separation insulating structure 24 may be disposed between the channel structures CH. In a plane defined in the first direction I and the second direction II, the separation insulating structure 24 may extend in the second direction II.

The first channel structure CH1 may include a first channel layer 15, a memory layer 16, and a first insulating core 17. The memory layer 16 may include a blocking layer 16A, a data storage layer 16B, or a tunnel insulating layer 16C, or include a combination thereof. The second channel structure CH2 may include a second channel layer 25, a gate insulating layer 26, and a second insulating core 27.

The second channel structure CH2 may have a width less than that of the first channel structure CH1. In the first direction I, the gate insulating layer 26 may have a width less than that of the memory layer 16. In the first direction I, the second channel layer 25 may have a width (W2<W1) less than that of the first channel layer 15. In the first direction I, the second insulating core 27 may have a width less than that of the first insulating core 17.

The second channel structure CH2 may extend into the first channel structure CH1. The gate insulating layer 26 may extend into the first channel structure CH1. The gate insulating layer 26 may include a first portion P1B and a second portion P2B. The first portion P1B may be interposed between the second channel layer 25 and the memory layer 16. The second portion P2B may be interposed between the second channel layer 25 and the second conductive layers 13. In the first direction I, the first portion P1B may have a width greater than that of the second portion P2B.

The third channel structure CH3 may include a third channel layer 18 configured to couple the first channel layer 15 with the second channel layer 25. The third channel structure CH3 may include a first portion P1A which comes into contact with the first channel layer 15, and a second portion P2A which comes into contact with the second channel layer 25. In the first direction I, the first portion P1A may have a width greater than that of the second portion P2A. The first portion P1A may come into contact with an inner surface of the first channel layer 15, and come into contact with an upper surface of the first insulating core 17. The second portion P2A may come into contact with an inner surface of the second channel layer 25 and extend along the inner surface of the second channel layer 25 in the third direction III. The upper surface of the second portion P2A and the upper surface of the second channel layer 25 may be disposed on substantially the same plane.

The second channel layer 25 may extend into the first channel structure CH1. A lower surface of the second channel layer 25 may be disposed at a level lower than that of the upper surface of the first channel layer 15. The second channel layer 25 may extend into the third channel structure CH3. A lower portion of the second channel layer 25 may be interposed between the first portion P1A and the second portion P2A.

The second conductive layer 13 may include a first portion P1C formed on the stack ST, and second portions P2C which respectively enclose the second channel structures CH2. In a cross-section defined in the first direction I and the third direction III, the second portions P2C may protrude into the stack ST toward the first channel structures CH1. The second portions P2C may protrude into the uppermost insulating layer 12 and come into contact with the separation insulating structure 24.

In a plane defined in the first direction I and the second direction II, the second portions P2C may protrude into the separation insulating structure 24. Hence, the separation insulating structure 24 may have a waved sidewall. In a plane, the second portions P2C may enclose overall sidewalls of the second channel structures CH2. Hence, a select transistor disposed on an intersection area of the second conductive layer 13 and the second channel structure CH2 may have a gate all around (GAA) structure.

The second conductive layer 13 may come into contact with the memory layers 16. The second portions P2C may protrude into the uppermost insulating layer 12 of the stack ST. The second portions P2C may come into contact with the memory layers 16. An outer wall P2C_OW of each of the second portions P2C may be aligned with an outer wall 16_OW of the corresponding memory layer 16.

In accordance with the structure described above, a second distance D2 between the second channel structures CH2 adjacent to each other in the first direction I is greater than a first distance D1 between the first channel structures CH1 adjacent to each other in the first direction I. Space for forming the separation insulation structure 24 and the second conductive layer 13 between the second channel structures CH2 may be secured. Therefore, select transistors disposed adjacent to the separation insulating structure 24 may be used as real transistors rather than being used as dummy transistors. Furthermore, the select transistors may have a uniform shape and thus have uniform characteristics.

FIGS. 3A to 15A, and 3B to 15B are diagrams for describing a method of manufacturing a semiconductor device in accordance with an embodiment of the present disclosure. The drawings attached with reference character A are plan view, and the drawings attached with reference character B are sectional views taken along line B-B' of the drawings attached with reference character A. Hereinbelow, repetitive explanation will be omitted if deemed redundant.

Figure 3A:
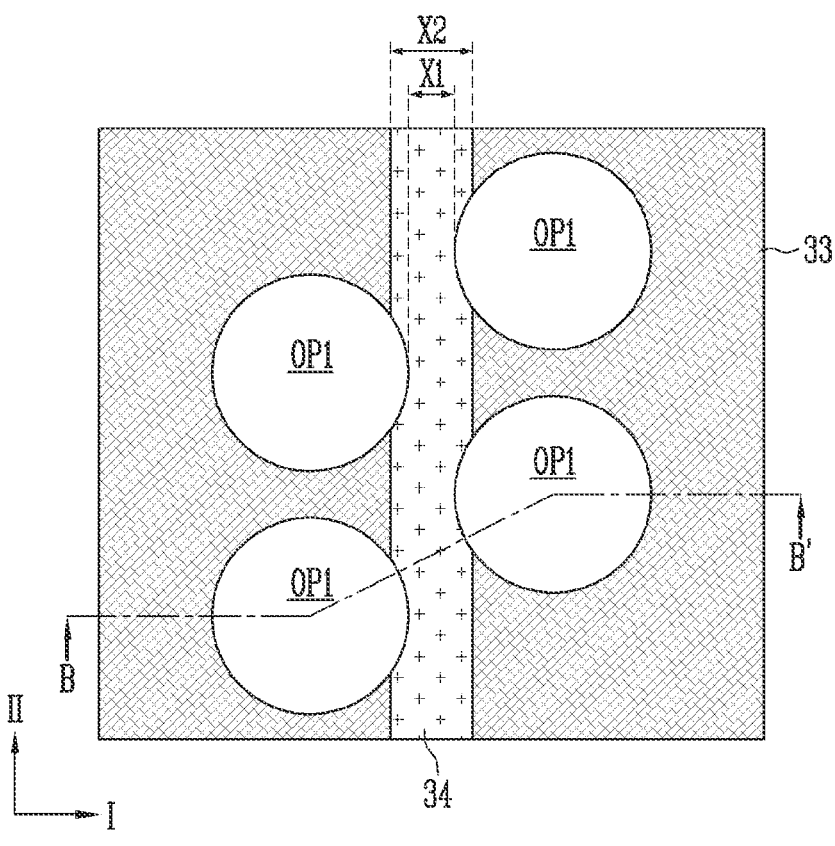
FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, and 15B are diagrams for describing a method of manufacturing a semiconductor device in accordance with an embodiment of the present disclosure.
Figure 3B:
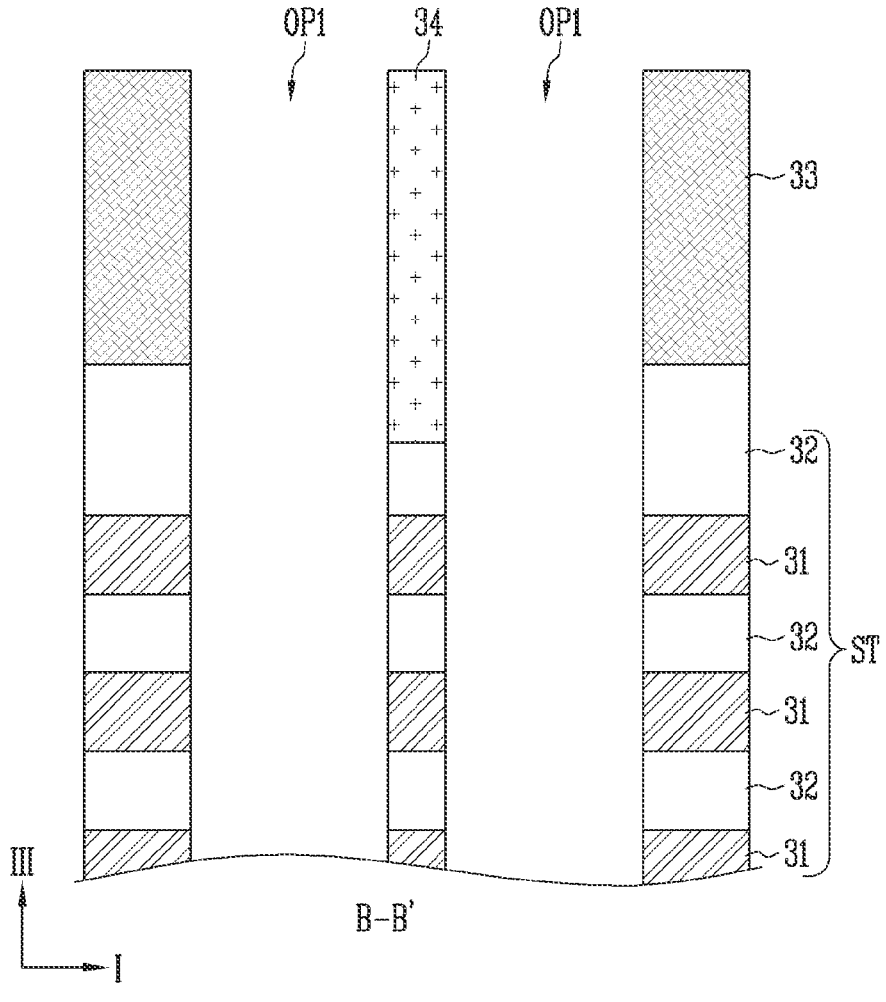

Referring to FIGS. 3A and 3B, a stack ST including first material layers 31 and second material layers 32 which are alternately stacked is formed. The first material layers 31 may include material having a high etch selectivity with respect to the second material layers 32. For example, the first material layers 31 may include sacrificial material such as nitride, and the second material layers 32 may include insulating material such as oxide. Alternatively, the first material layers 31 may be conductive material such as polysilicon, tungsten, or molybdenum, and the second material layers 32 may include insulating material such as oxide. The second material layers 32 may have a uniform thickness or have different thicknesses. In an embodiment, the uppermost second material layer 32 may have a thickness greater than that of the other second material layers 32.

Subsequently, a sacrificial layer 33 is formed on the stack ST. The sacrificial layer 33 may include material having a high etch selectivity with respect to the second material layers 32. In an embodiment, the sacrificial layer 33 may include a nitride layer, a carbon layer, an amorphous carbon layer, etc.

Thereafter, at least one separation insulating structure 34 that passes through the sacrificial layer 33 is formed. The separation insulating structure 34 may be disposed on the stack ST. In a plane view, the separation insulating structure 34 may have a line shape extending in the second direction II. In a cross-section, the separation insulating structure 34 may extend into the stack ST and come into contact with the uppermost second material layer 32. The separation insulating structure 34 may be spaced apart from the uppermost first material layer 31 in the third direction III.

Thereafter, first openings OP1 that pass through the sacrificial layer 33 and the stack ST are formed. When the first openings OP1 are formed, the separation insulating structure 34 may be etched. The first openings OP1 may pass through the separation insulating structure 34. The separation insulating structure 34 may be exposed through the first openings OP1. In the first direction I, a width X2 of the separation insulating structure 34 may be greater than a distance X1 between the first openings OP1.

Figure 4A:
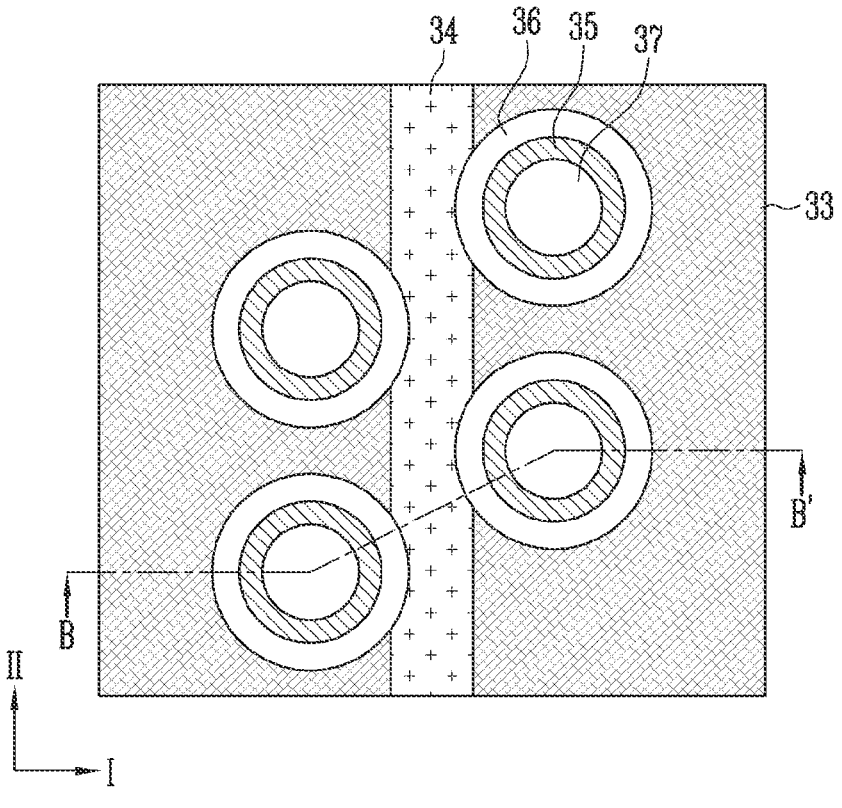
Figure 4B:
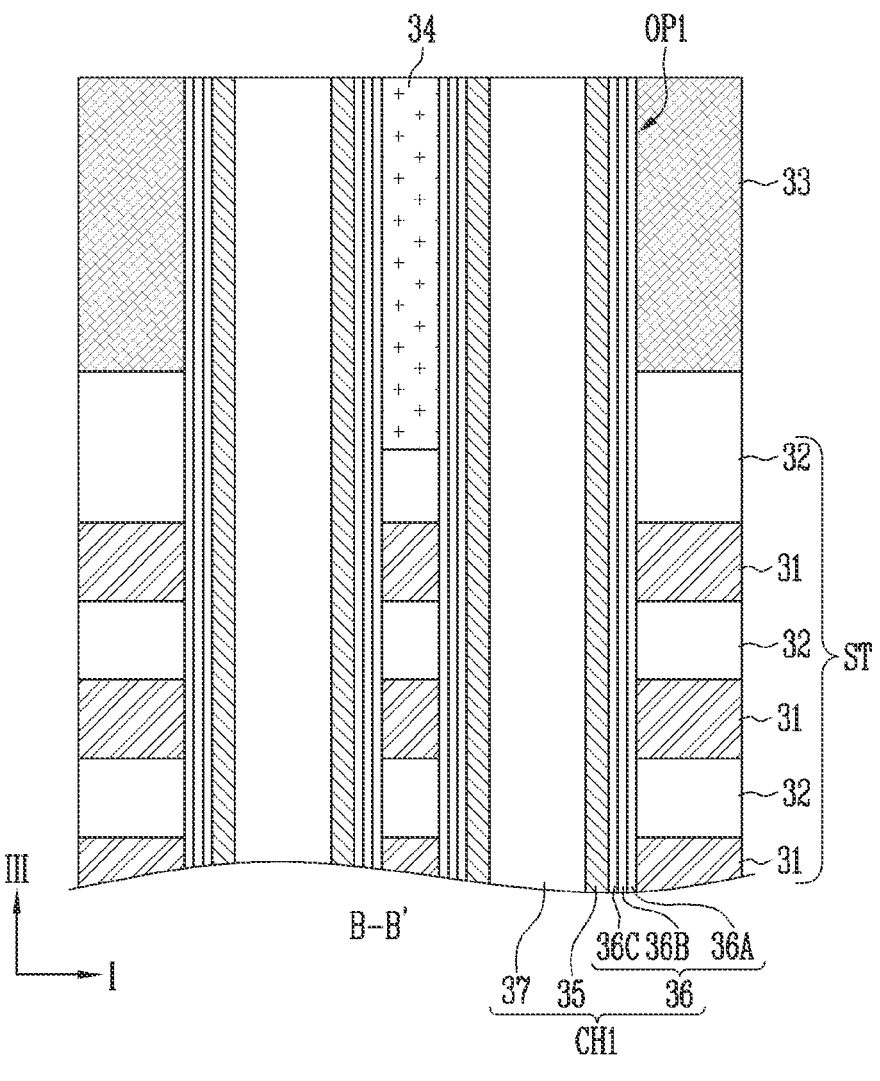

Referring to FIGS. 4A and 4B, the first channel structures CH1 are formed in the first openings OP1. Each of the first channel structures CH1 may include a first channel layer 35, a memory layer 36, and a first insulating core 37. The memory layer 36 may include a blocking layer 36A, a data storage layer 36B, or a tunnel insulating layer 36C, or include a combination thereof. In an embodiment, after the memory layer 36, the first channel layer 35, and the first insulating core 37 are sequentially formed, the first channel structures CH1 may be formed by performing a planarization process until a surface of the sacrificial layer 33 is exposed.

Figure 5A:
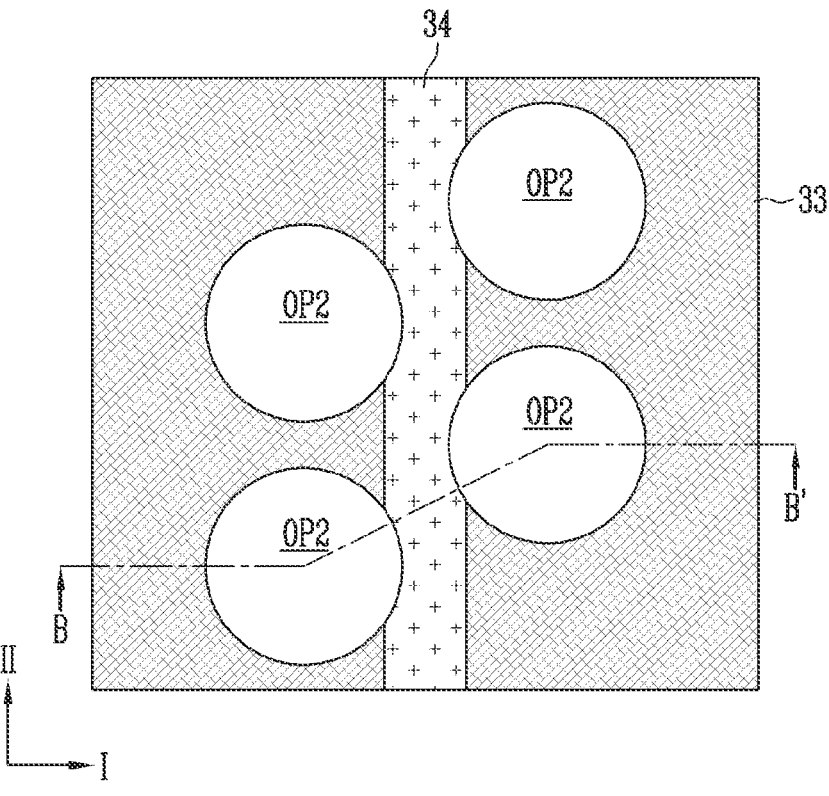
Figure 5B:
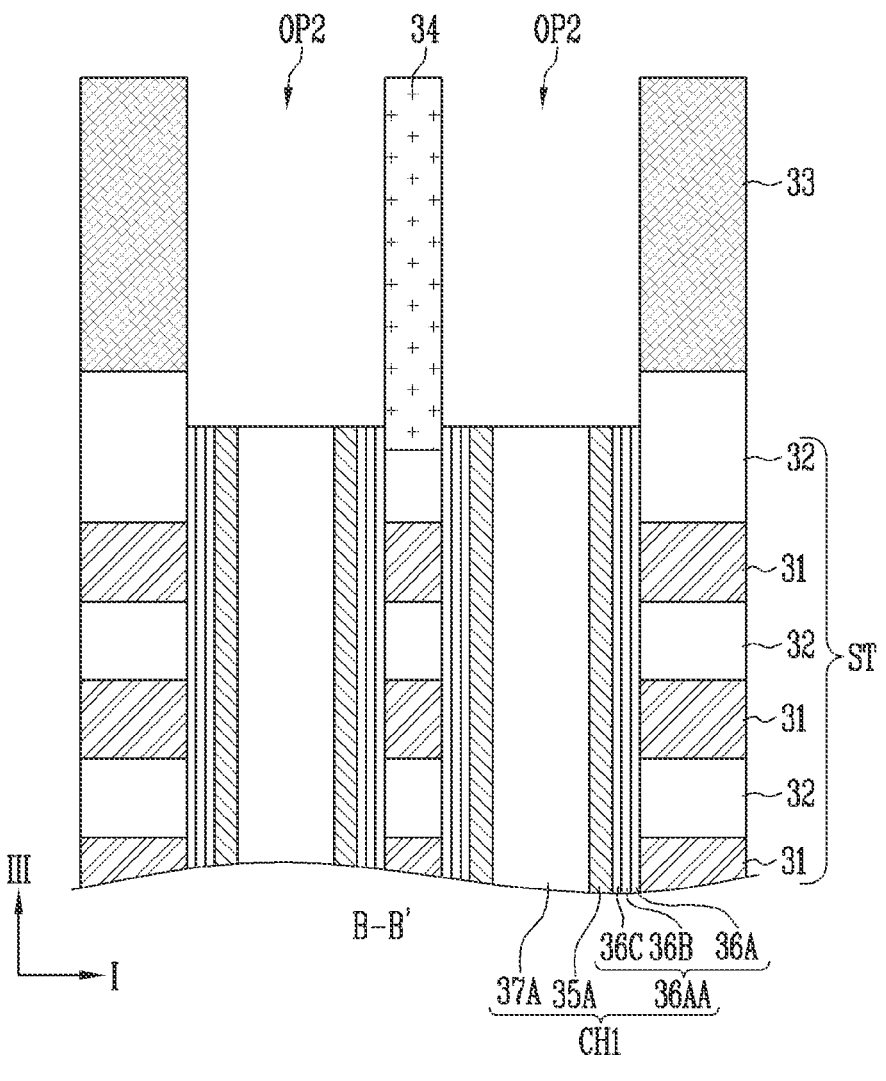

Referring to FIGS. 5A and 5B, second openings OP2 are formed by etching the first channel structure CH1. In an embodiment, the first channel layer 35 is exposed by etching the first insulating core 37, and the memory layer 36 is exposed by etching the exposed first channel layer 35. Thereafter, the second openings OP2 may be formed by etching the exposed memory layer 36. Thereby, a memory layer 36AA, a first channel layer 35A, and a first insulating core 37A may be formed.

The second openings OP2 may be formed to have a predetermined depth such that the uppermost first material layer 31 is prevented from being exposed. The bottom of each second opening OP2 may be disposed between a lower surface of the sacrificial layer 33 and an upper surface of the uppermost first material layer 31. The sacrificial layer 33 and the separation insulating structure 34 may be exposed through the second openings OP2.

Figure 6A:
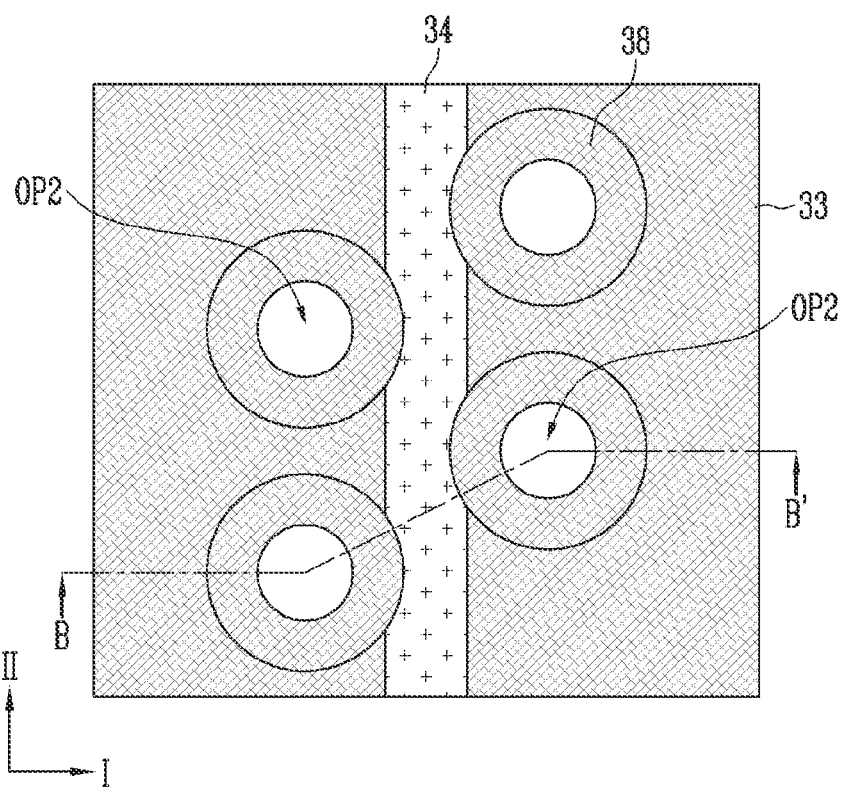
Figure 6B:
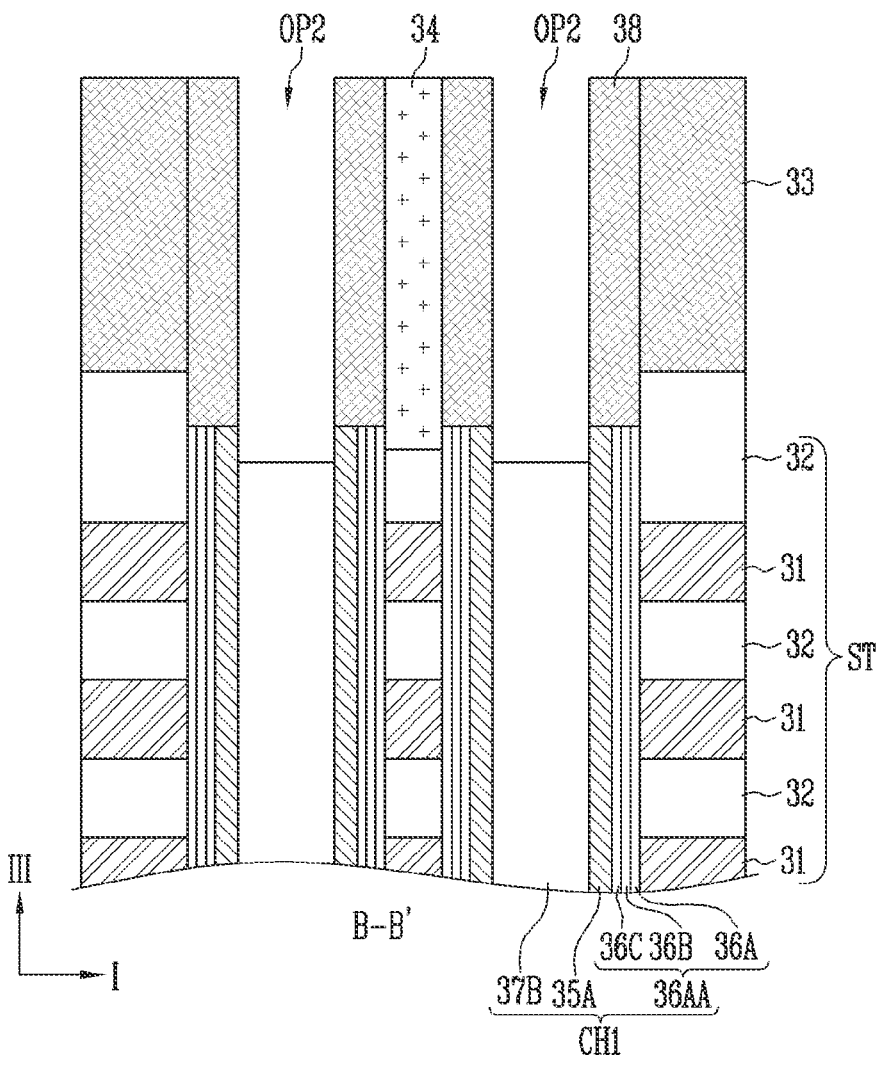

Referring to FIGS. 6A and 6B, sacrificial spacers 38 are formed in the second openings OP2. The sacrificial spacers 38 may include material having a high etch selectivity with respect to the second material layers 32. In an embodiment, the sacrificial layer 33 may include a nitride layer, a carbon layer, an amorphous carbon layer, etc.

The sacrificial spacers 38 may be coupled with the sacrificial layer 33. The sacrificial spacers 38 may be formed on the first channel structures CH1. The sacrificial spacers 38 may be disposed on the first channel layers 35 and the memory layers 36 and configured to expose the first insulating core 37A. In an embodiment, after sacrificial material layers are formed along inner surfaces of the second openings OP2, the sacrificial spacers 38 may be formed by etching overall surfaces of the sacrificial material layers. When the sacrificial material layer is etched, the first insulating core 37A may be partially etched. An upper surface of an etched first insulating core 37B may be disposed at a position lower than an upper surface of the first channel layer 35A. The first channel layer 35A may be exposed through the second openings OP2.

Figure 7A:
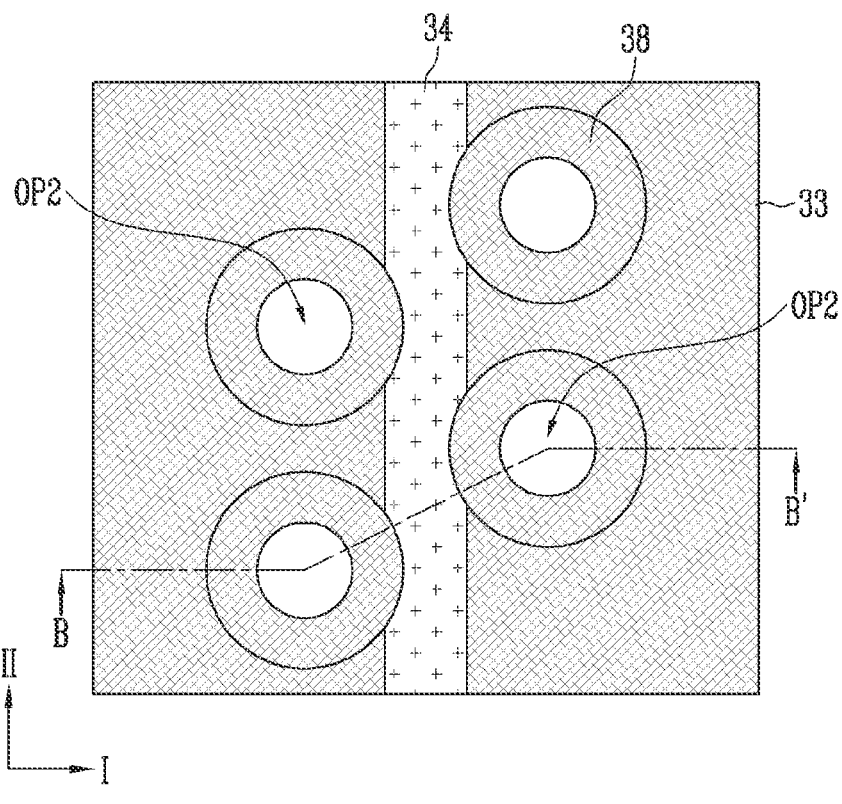
Figure 7B:
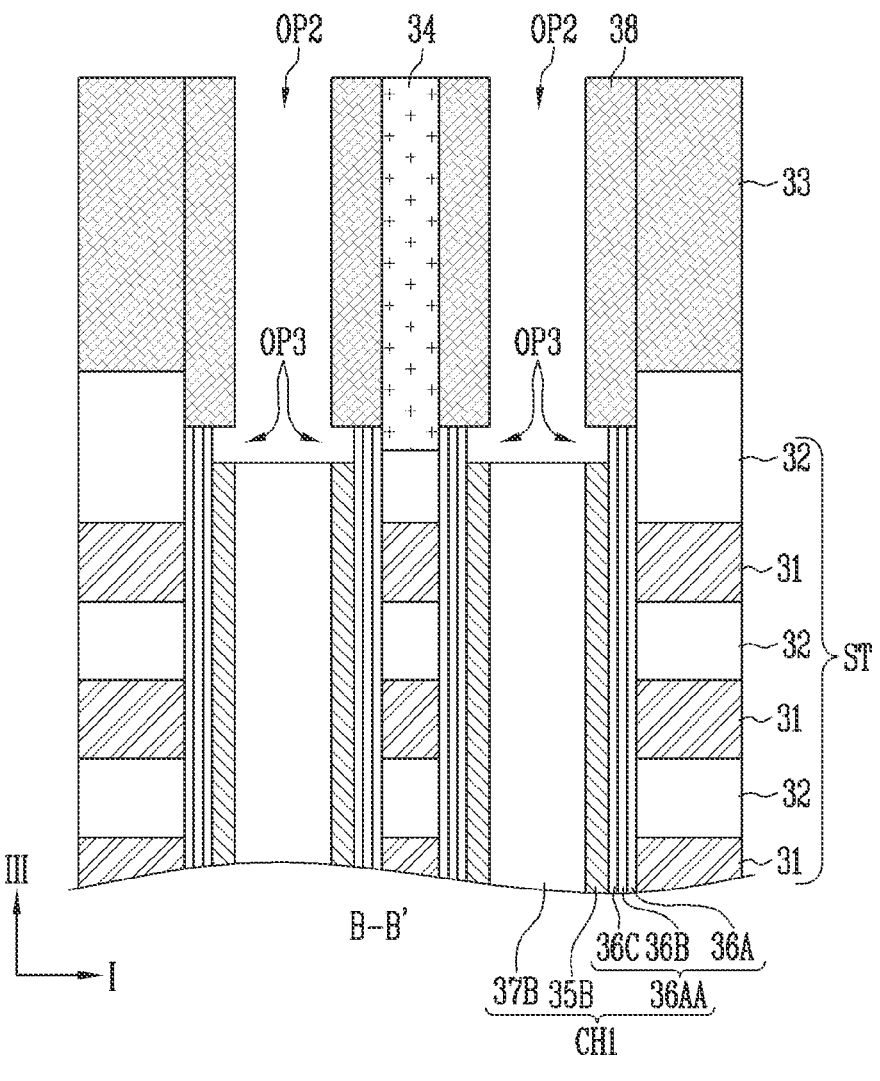

Referring to FIGS. 7A and 7B, third openings OP3 are formed by etching the first channel layers 35A through the second openings OP2. The first channel layers 35A that are exposed from the sacrificial spacers 38 and the first insulating cores 37B may be selectively etched. Upper surfaces of etched first channel layers 35B may be disposed at a level substantially equal to the upper surfaces of the first insulating cores 37B. The third openings OP3 may be coupled with the second openings OP2. The memory layers 36AA may be exposed through the third openings OP3.

Figure 8A:
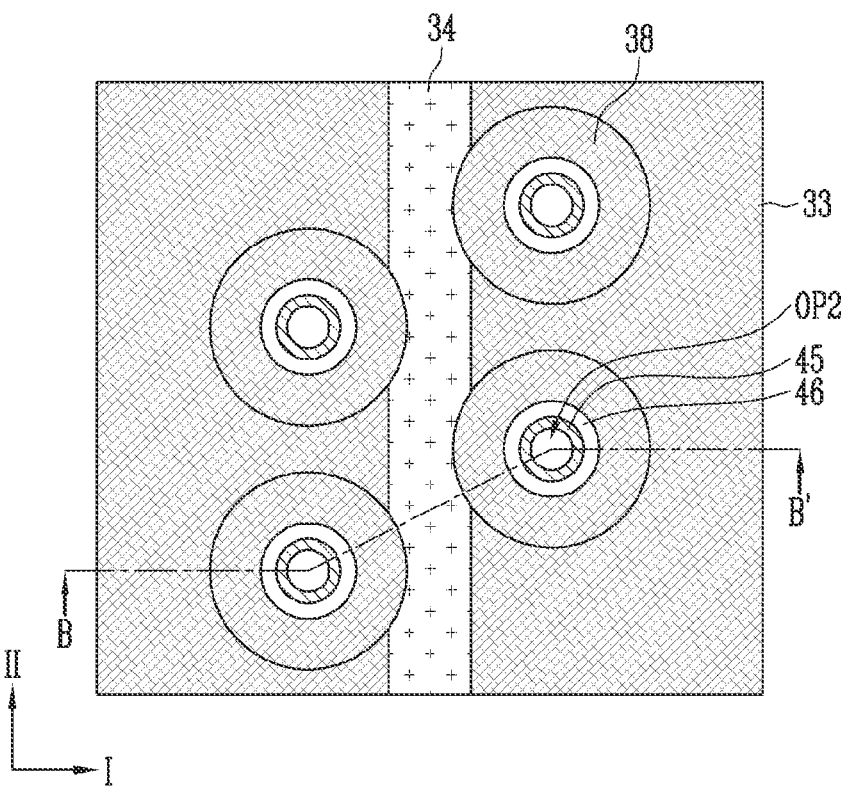
Figure 8B:
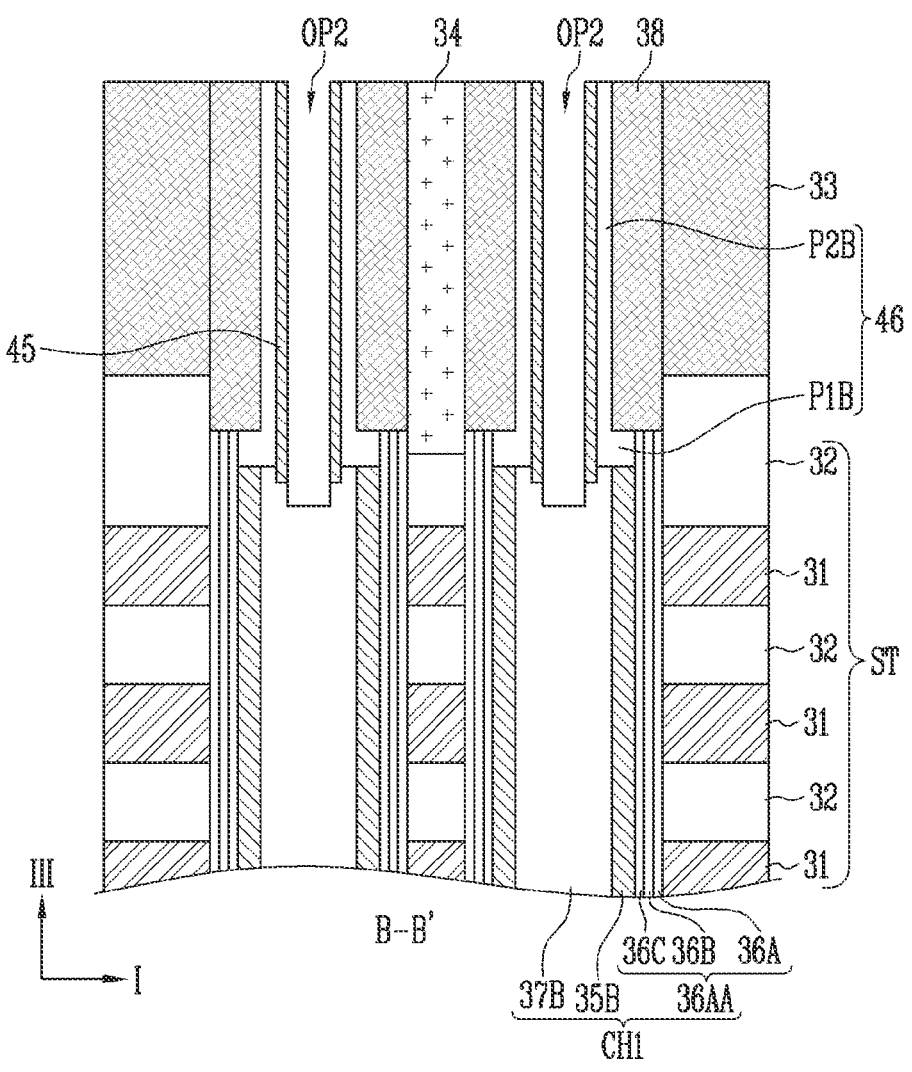

Referring to FIGS. 8A and 8B, gate insulating layers 46 are formed in the second openings OP2. Each gate insulating layer 46 may be disposed over the corresponding first channel structure CH1 and extend into the third opening OP3. Each of the gate insulating layers 46 may include a first portion P1B in the corresponding third opening OP3, and a second portion P2B in the corresponding second opening OP2.

Thereafter, second channel layers 45 are formed in the respective second openings OP2. In an embodiment, after channel material layers are formed along the inner surfaces of the second openings OP2, the second channel layers 45 may be formed by etching overall surfaces of the channel material layers. When the channel material layer is etched, the first insulating core 37B may be partially etched. Since the gate insulating layers 46 and the second channel layers 45 are formed after the second openings OP2 have been reduced in width by the sacrificial spacers 38, the width of the second channel layers 45 may be less than that of the first channel layers 35B.

Figure 9A:
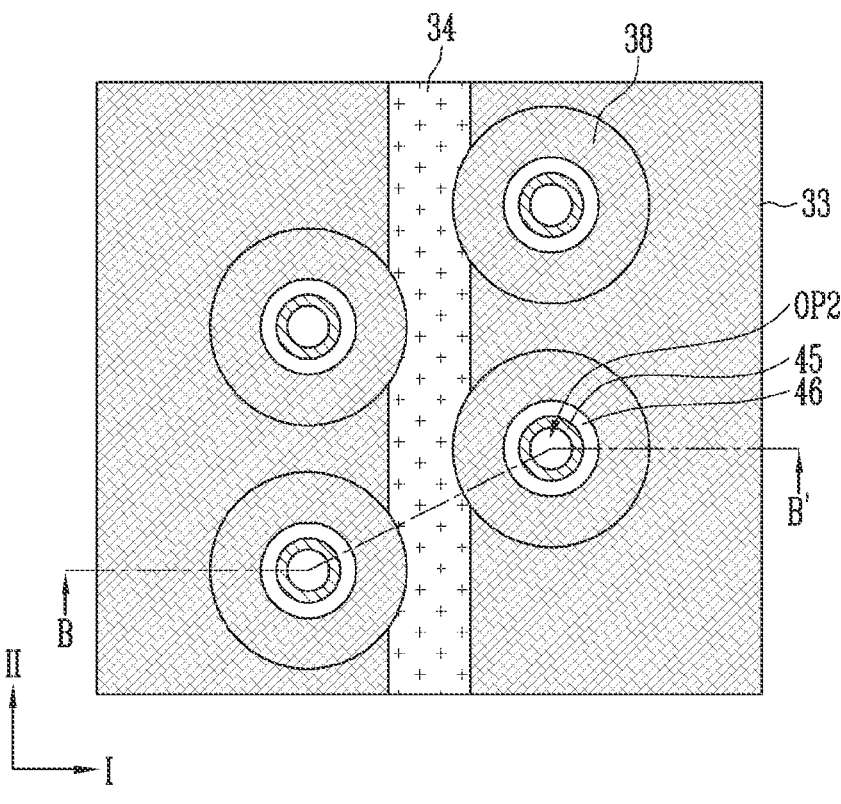
Figure 9B:
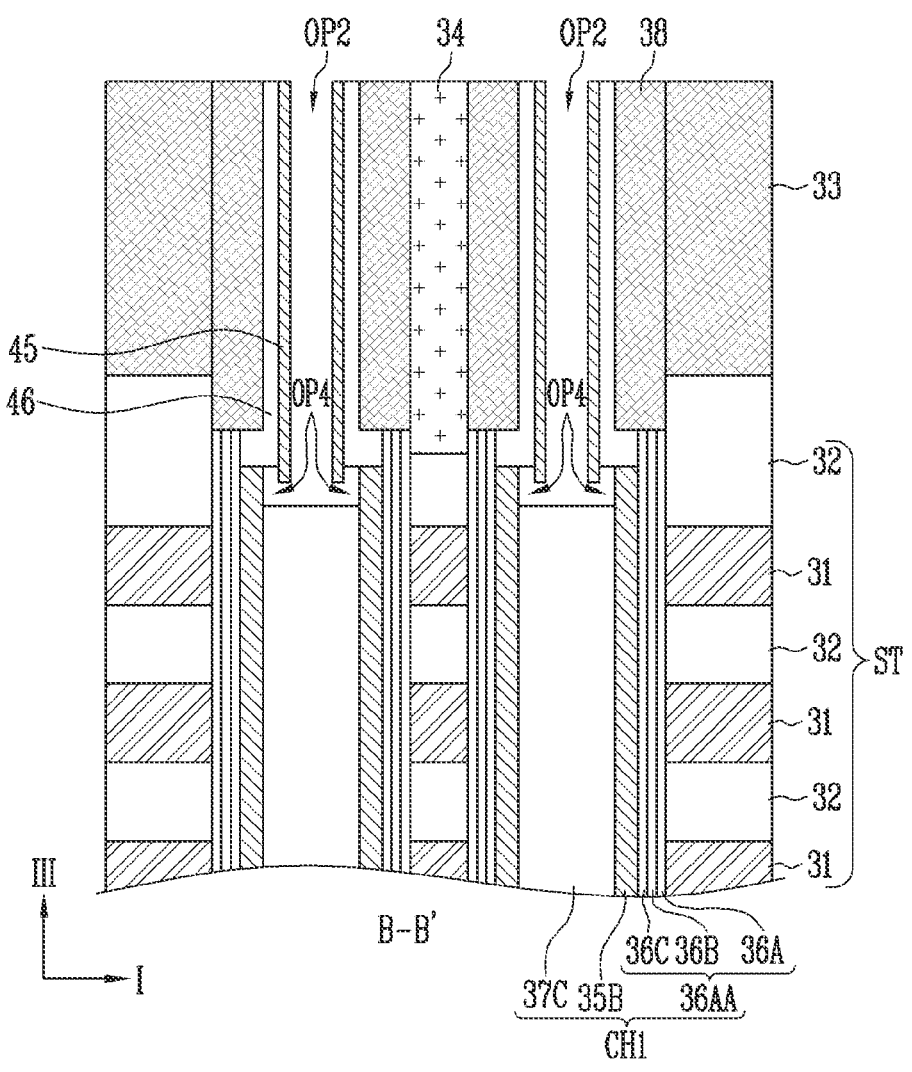

Referring to FIGS. 9A and 9B, fourth openings OP4 are formed by etching the first insulating core 37B through the second openings OP2. The first insulating core 37B exposed from the second channel layers 45 may be selectively etched. An upper surface of an etched first insulating core 37C may be disposed at a position lower than the upper surface of the first channel layer 35B. The first channel layers 35B may be exposed through the fourth openings OP4.

Figure 10A:
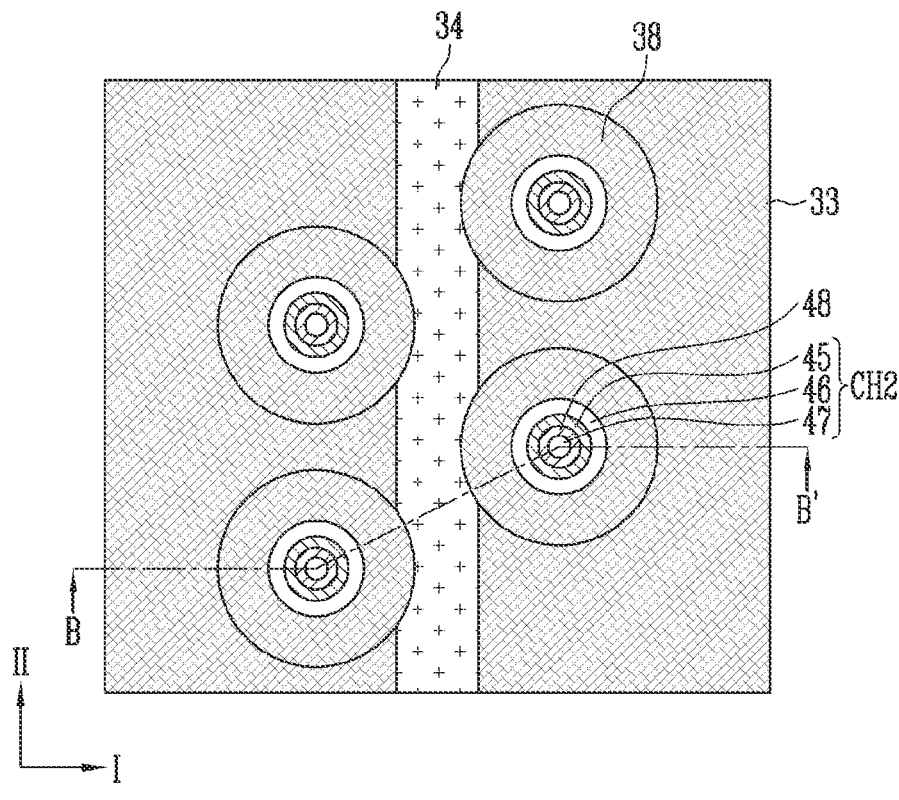
Figure 10B:
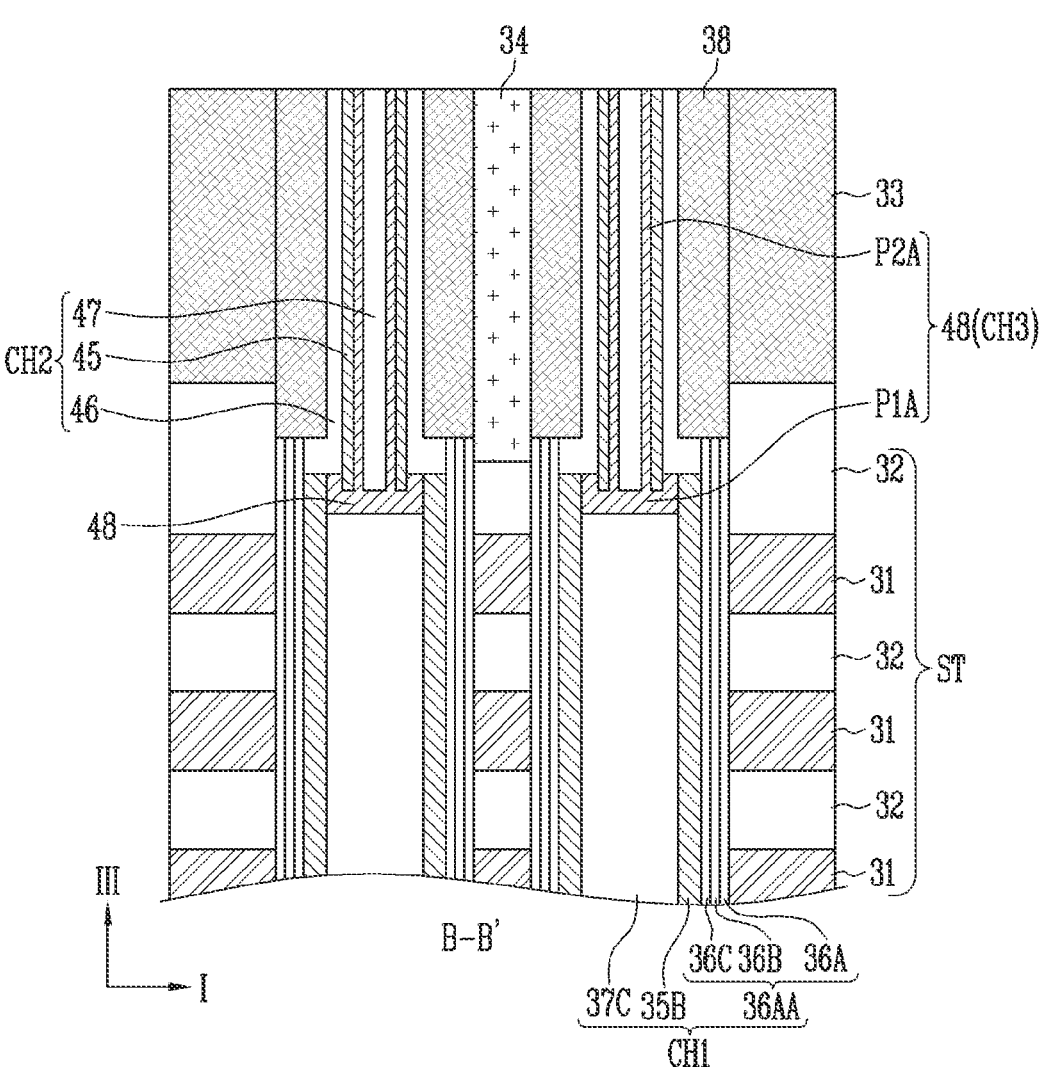

Referring to FIGS. 10A and 10B, the third channel structures CH3 are formed. The third channel structures CH3 may include third channel layers 48, respectively. The third channel layers 48 may be formed in the fourth openings OP4 and respectively couple the first channel layers 35B with the second channel layers 45. The third channel layers 48 may extend into the second openings OP2. Each of the third channel layers 48 may include a first portion P1A formed in the corresponding fourth opening OP4, and a second portion P2A formed in the corresponding second opening OP2.

Thereafter, second insulating cores 47 are formed in the second openings OP2. The second insulating cores 47 may be disposed in the second portions P2A. Eventually, the second channel structures CH2 each including the second channel layer 45, the gate insulating layer 46, and the second insulating core 47 may be formed.

Figure 11A:
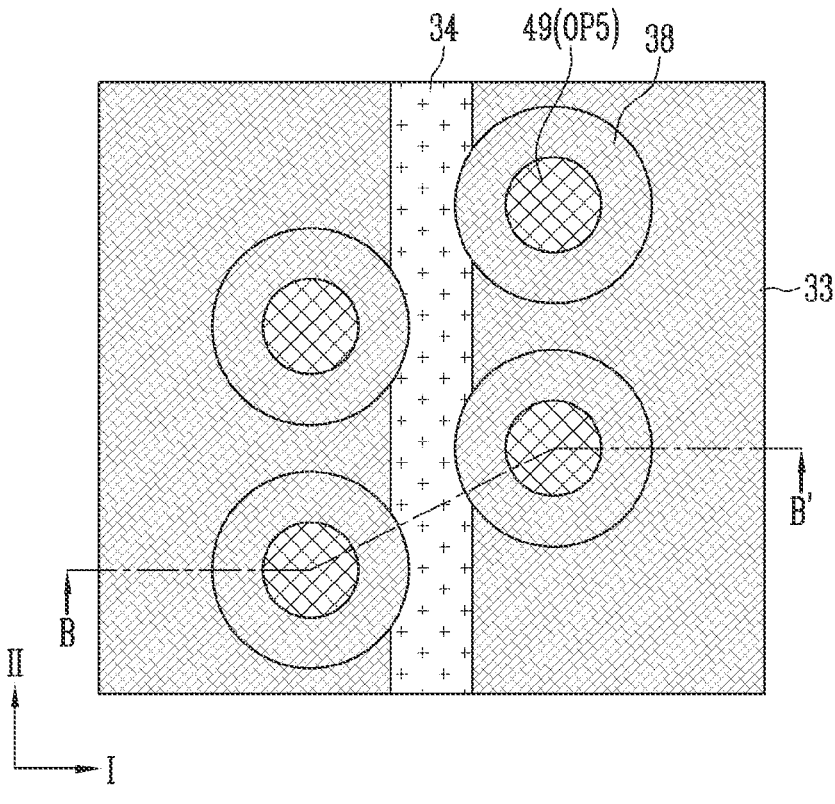
Figure 11B:
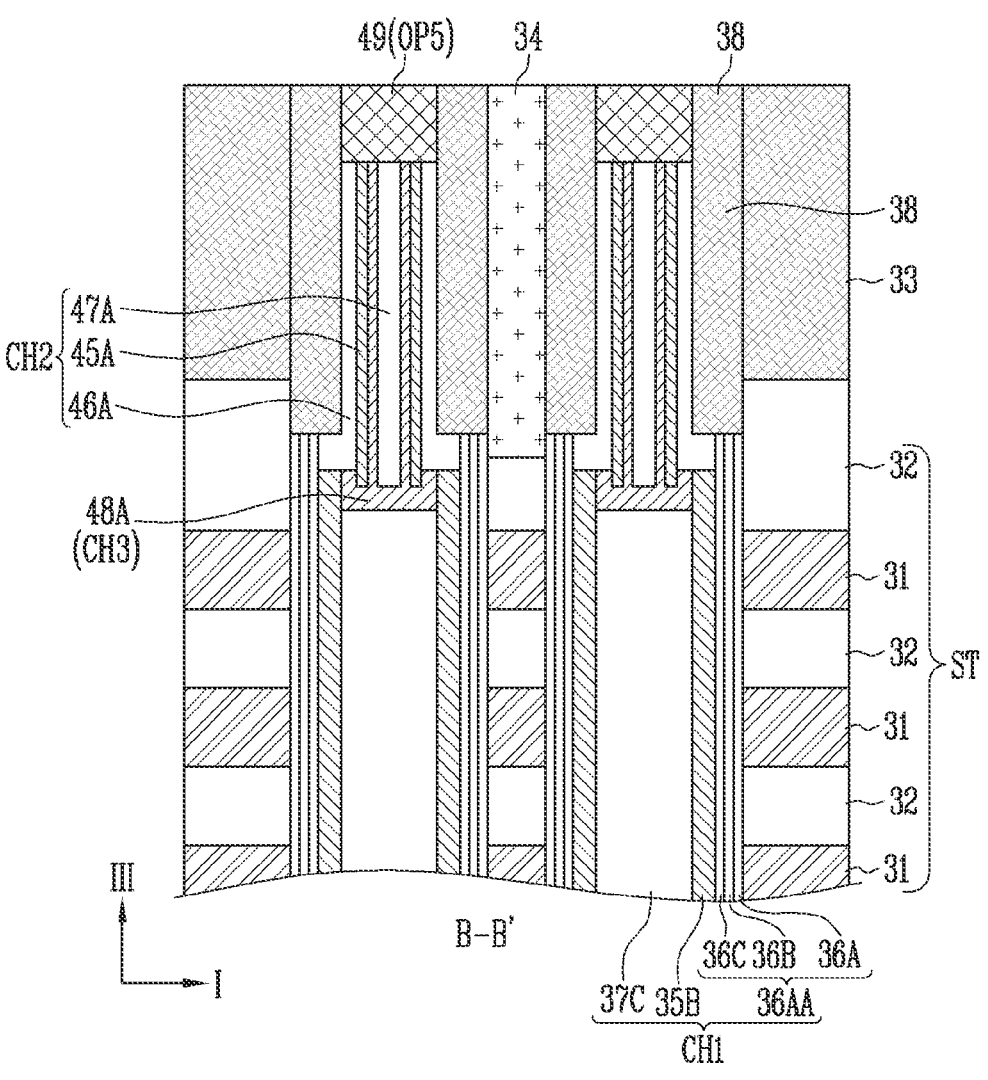

Referring to FIGS. 11A and 11B, contact pads 49 are formed. In an embodiment, after fifth openings OP5 are formed by etching the gate insulating layer 46, the second channel layer 45, the second insulating core 47, and the third channel layer 48, the contact pads 49 are formed in the fifth openings OP5. The contact pads 49 may be disposed over the second channel layers 45A, the gate insulating layers 46A, the second insulating cores 47A, and the third channel layers 48A. The contact pads 49 may be coupled with the second channel layers 45A.

Figure 12A:
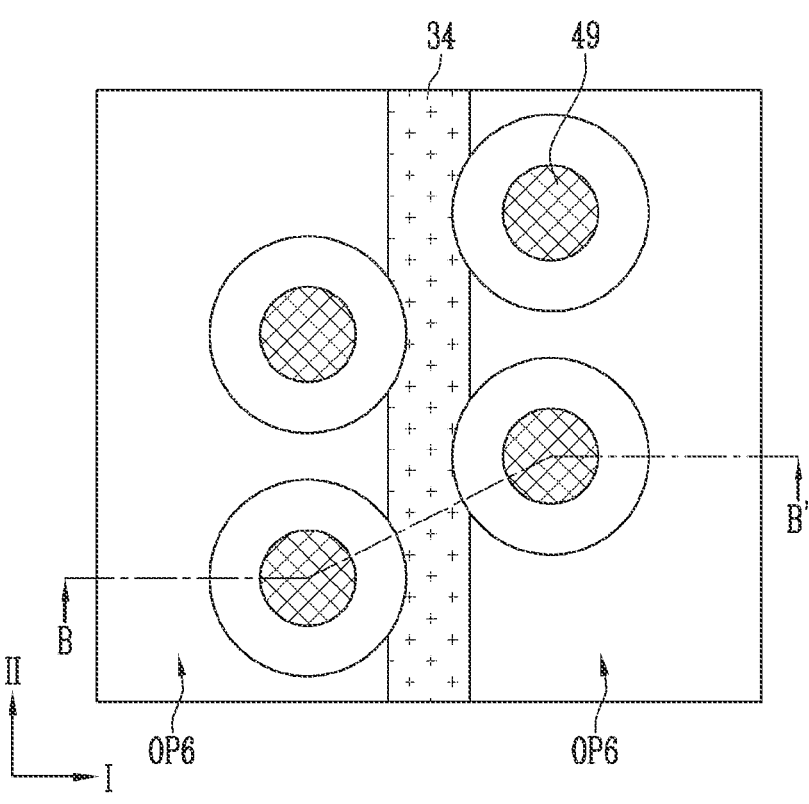
Figure 12B:
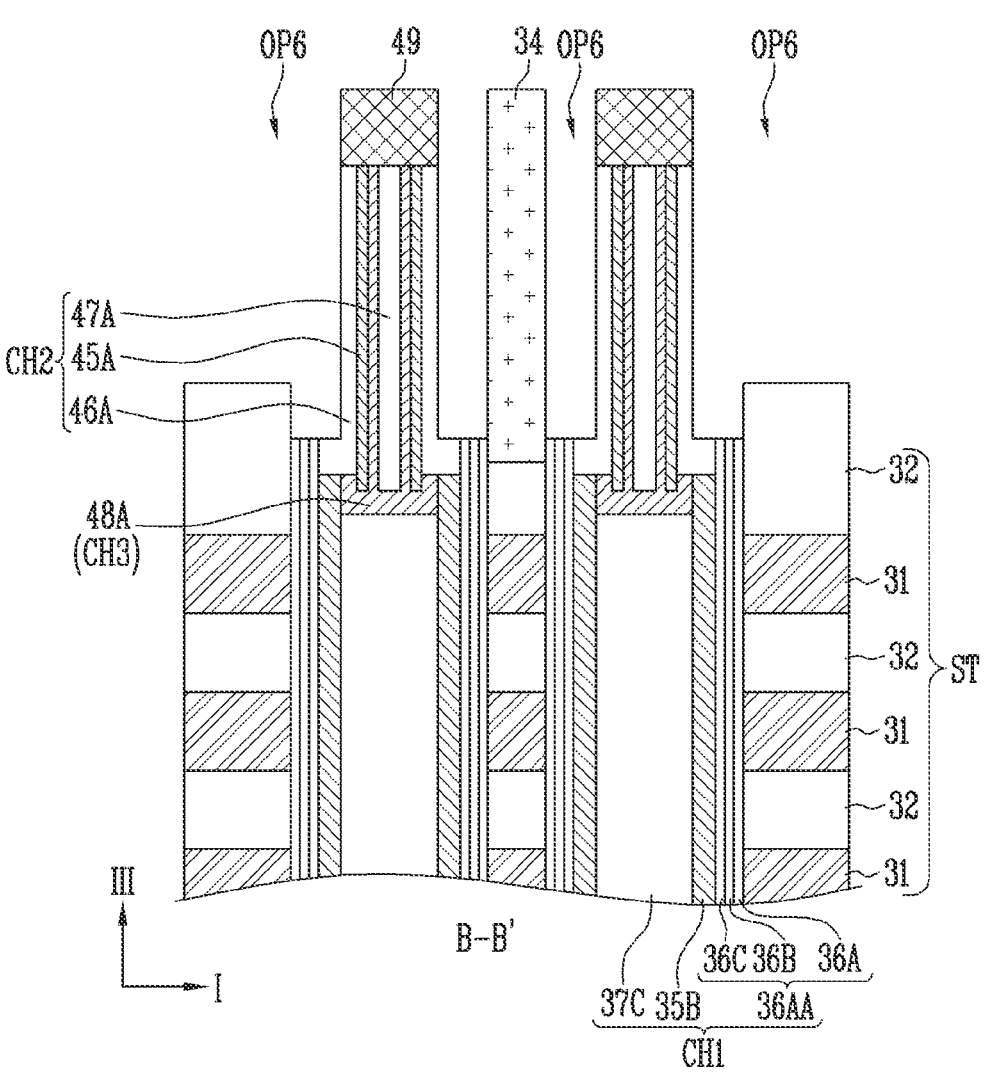

Referring to FIGS. 12A and 12B, sixth openings OP6 are formed by removing the sacrificial layer 33 and the sacrificial spacers 38. The sixth openings OP6 may be formed by selectively etching the sacrificial layer 33 and the sacrificial spacers 38. The sixth openings OP6 may be separated from each other by the separation insulating structure 34. The uppermost second material layer 32 and the second channel structure CH2 may be exposed through the sixth openings OP6. The sixth openings OP6 may extend into the second material layer 32 and expose the memory layer 36AA.

Figure 13A:
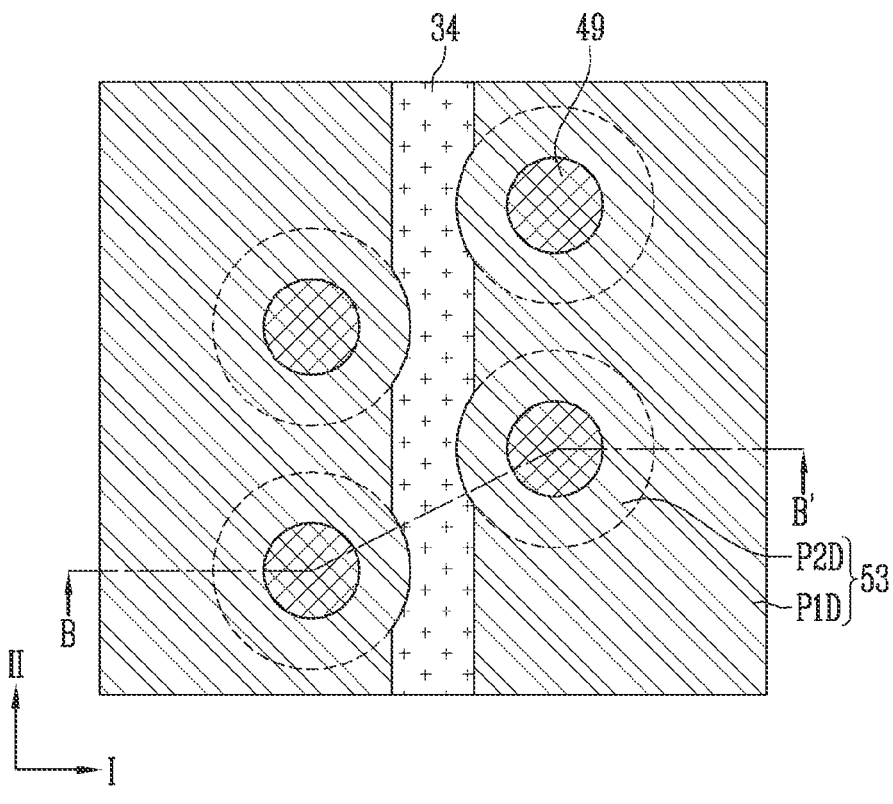
Figure 13B:
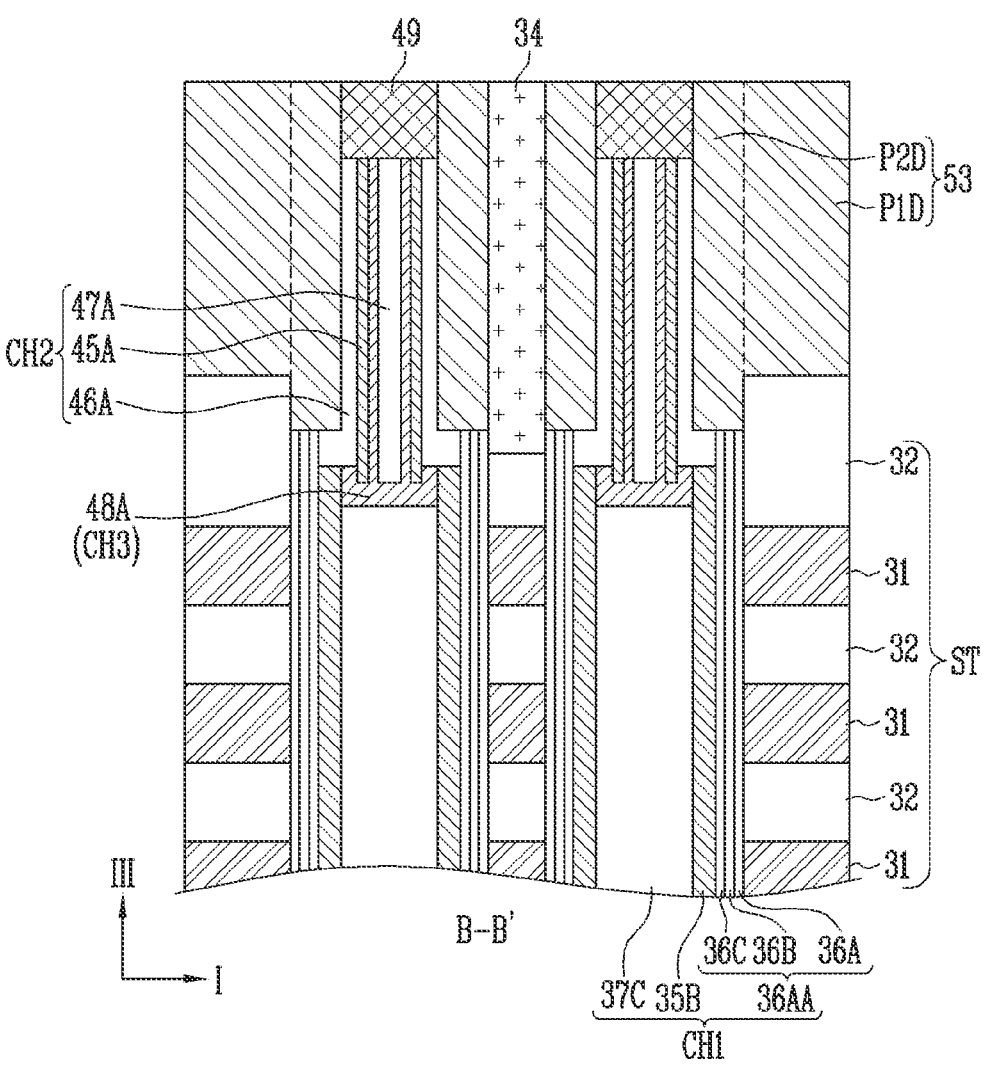

Referring to FIGS. 13A and 13B, the conductive layers 53 are respectively formed in the sixth openings OP6. The conductive layers 53 may be separated from each other by the separation insulating structure 34. Each of the conductive layers 53 may include a first portion P1D disposed over the stack ST, and second portions P2D which respectively enclose the second channel structures CH2. The second portions P2D may protrude into the stack ST toward the first channel structures CH1.

Figure 14A:
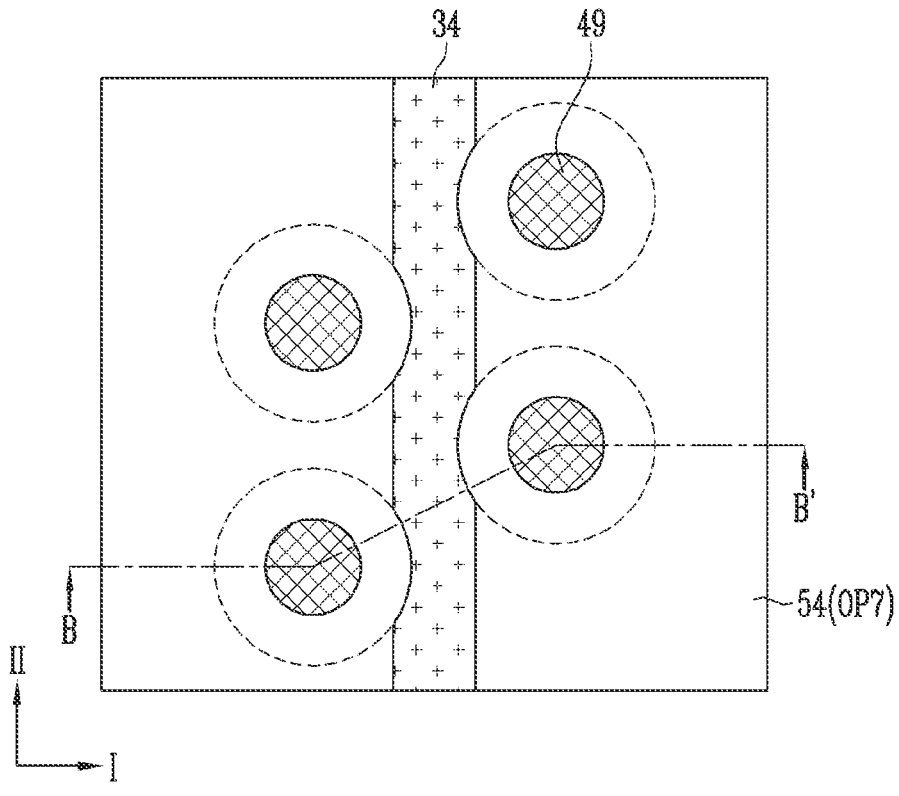
Figure 14B:
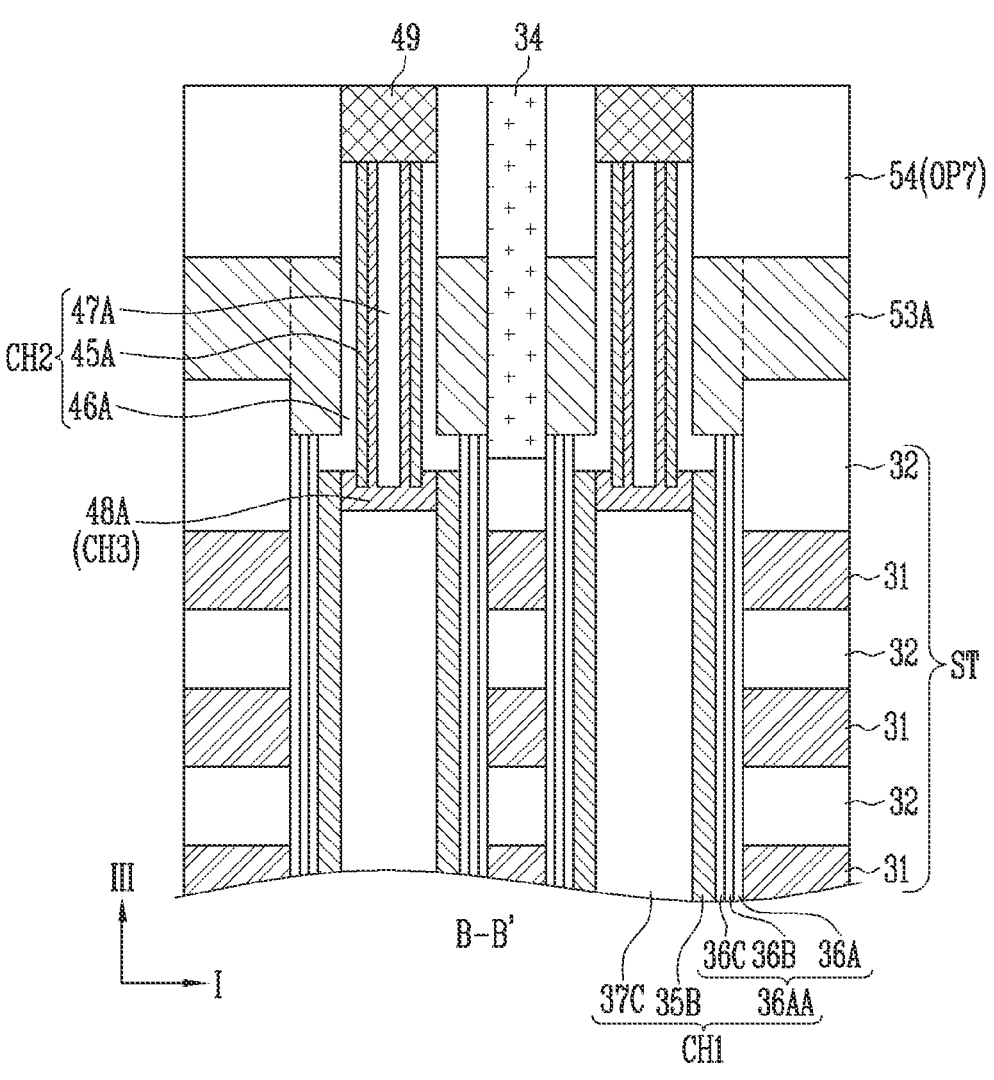

Referring to FIGS. 14A and 14B, the seventh openings OP7 are formed by etching the conductive layers 53. In an embodiment, the seventh openings OP7 may be formed by etching back the conductive layers 53. The seventh openings OP7 may be separated from each other by the separation insulating structure 34. The etched conductive layers 53A may be spaced apart from the contact pad 49 in the third direction III. The second channel structures CH2 may protrude from upper surfaces of the conductive layers 53A. Thereafter, insulating layers 54 may be formed in the seventh openings OP7.

Figure 15A:
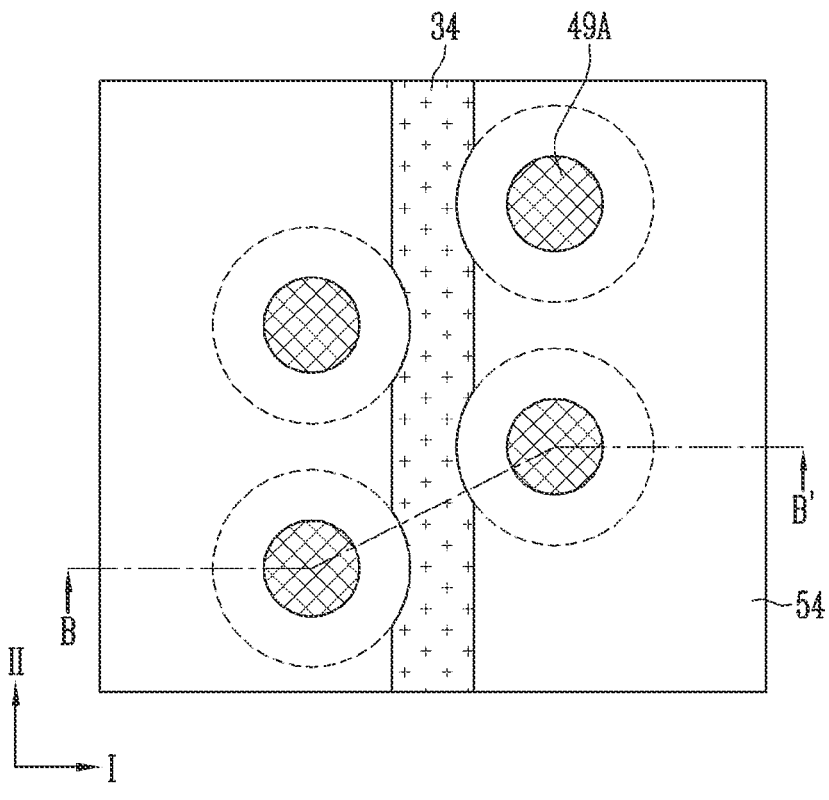
Figure 15B:
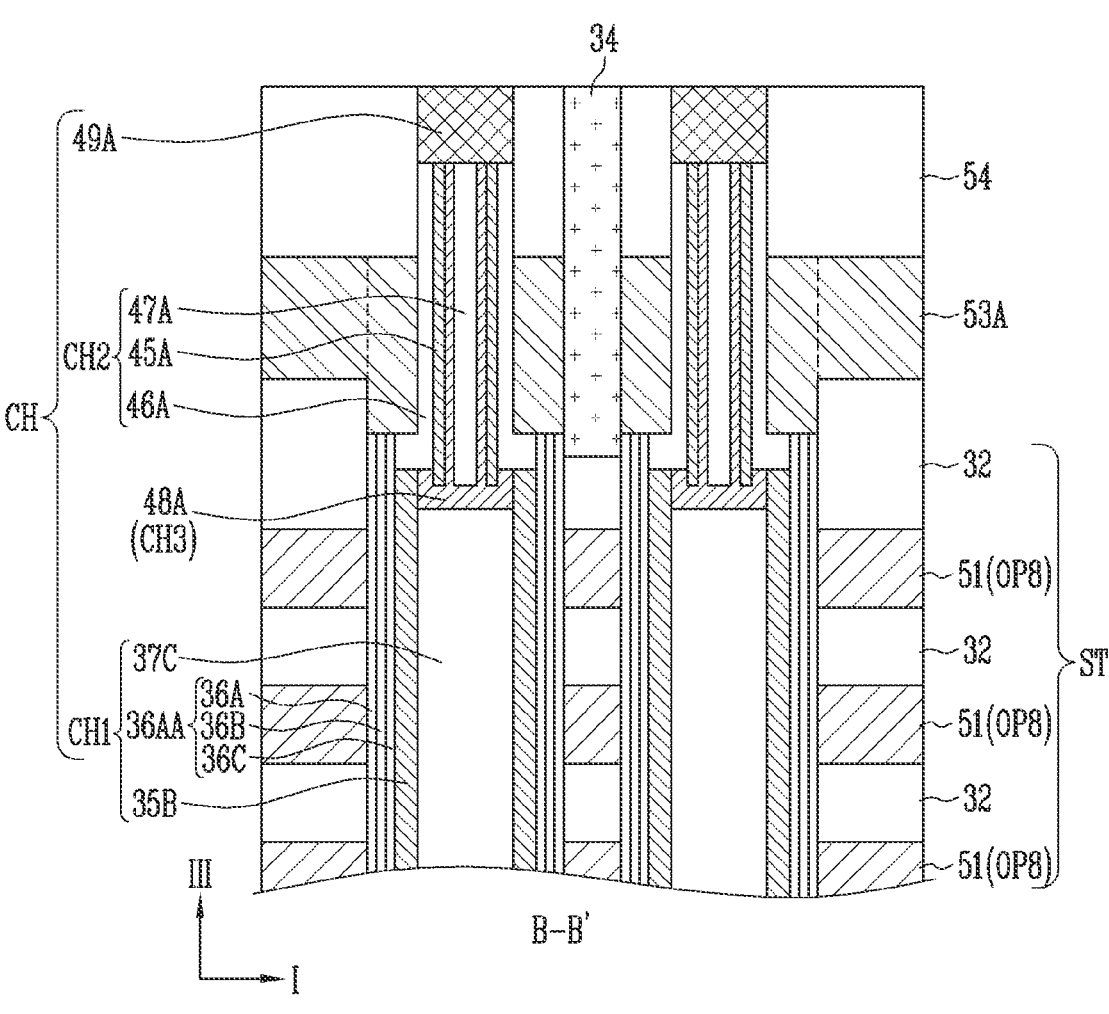

Referring to FIGS. 15A and 15B, the first material layers 31 are replaced with third material layers 51. For example, in the case where the first material layers 31 include sacrificial material and the second material layers 32 include insulating material, the third material layers 51 may include conductive material such as polysilicon, tungsten, molybdenum, or metal. After eighth openings OP8 are formed by forming a slit passing through the stack ST and removing the first material layers 31 through the slit, the third material layers 51 may be formed in the eighth openings OP8. Alternatively, in the case where the first material layers 31 include conductive material and the second material layers 32 include insulating material, the third material layers 51 including metal silicide material may be formed by silicidizing the first material layers 31.

Subsequently, impurities may be doped into the contact pads 49. Eventually, the channel structures CH each including a first channel structure CH1, a second channel structure CH2, a third channel structure CH3, and a contact pad 49A may be formed.

In accordance with the manufacturing method described above, the conductive layers 53A may be formed after the separation insulating structure 34 is formed. Therefore, the conductive layers 53A may be formed in a self-alignment scheme. Furthermore, the conductive layers 53A may be formed by filling the sixth openings OP6 with material, so that even though a plurality of separation insulation structures 34 are present on the stack ST, the sacrificial spacers 38 and the sacrificial layer 33 may be replaced with a plurality of conductive layers 53A.

FIGS. 16A to 16I are views illustrating a method of manufacturing the semiconductor device according to an embodiment of the present disclosure. Hereinbelow, repetitive explanation will be omitted if deemed redundant.

Figure 16A:
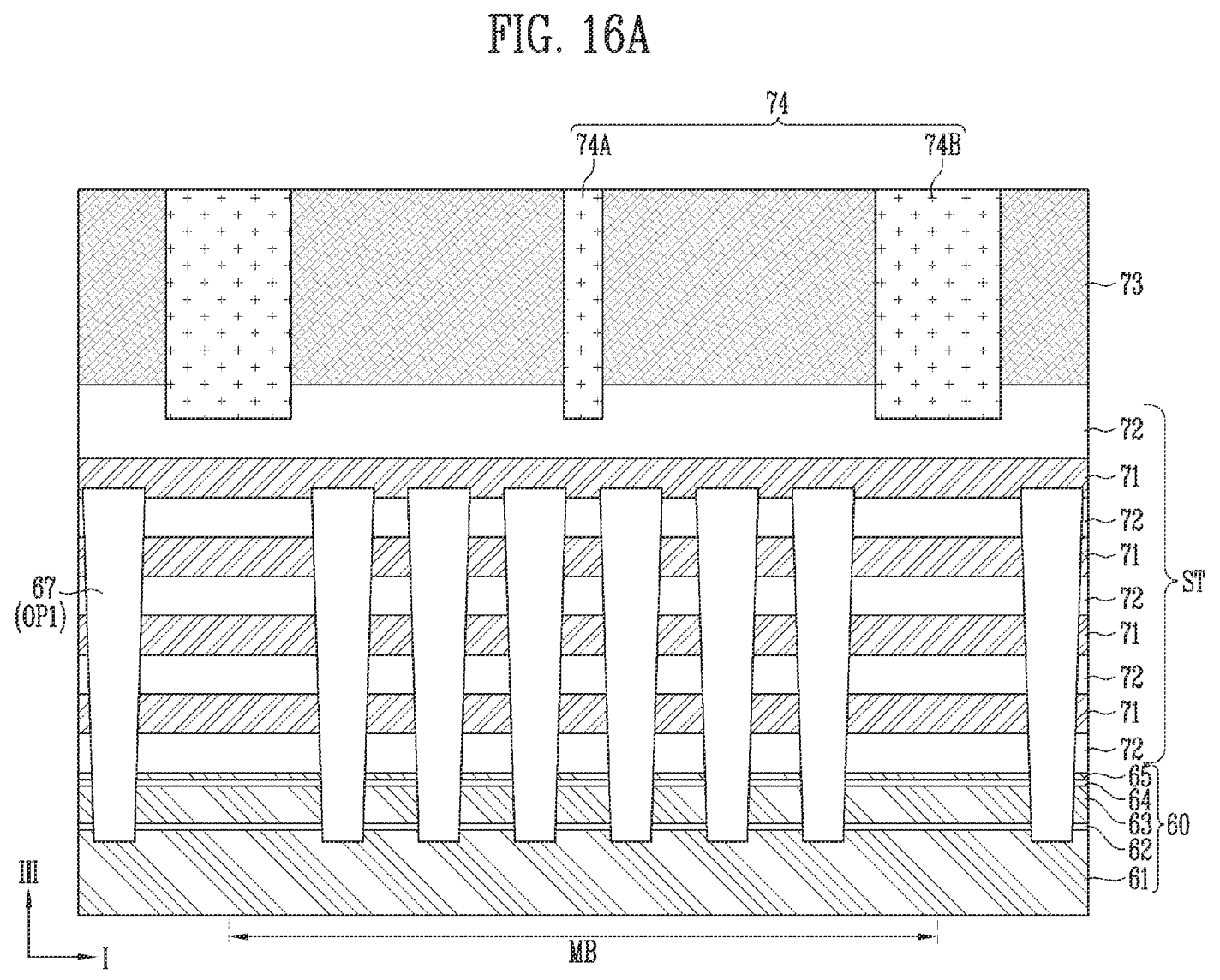

Referring to FIG. 16A, a source structure 60 is formed. The source structure 60 may include at least one source layer, and further include at least one sacrificial layer. In an embodiment, the source structure 60 may include a first source layer 61 and a second source layer 65, and further include a first sacrificial layer 63 interposed between the first source layer 61 and the second source layer 65. Furthermore, the source structure 60 may further include a second sacrificial layer 62 interposed between the first source layer 61 and the first sacrificial layer 63, or a third sacrificial layer 64 interposed between the first sacrificial layer 63 and the second source layer 65. The first source layer 61 and the second source layer 65 may include conductive material such as polysilicon, tungsten, molybdenum, or metal. The first sacrificial layer 63 may include material having a high etch selectivity with respect to the second sacrificial layer 62 and the third sacrificial layer 64. In an embodiment, the first sacrificial layer 63 may include polysilicon or nitride. The second sacrificial layer 62 and the third sacrificial layer 64 may include oxide.

Subsequently, a stack ST is formed on the source structure 60. The stack ST may include first material layers 71 and second material layers 72 that are alternately stacked. The stack ST may be formed by operations that are performed a plurality of times. In an embodiment, after a first stack including at least one first material layer 71 and at least one second material layer 72 is formed, first openings OP1 are formed to pass through the first stack. Thereafter, sacrificial pillars 67 are formed in the first openings OP1. Subsequently, a second stack including at least one first material layer 71 and at least one second material layer 72 is formed. Therefore, the stack ST including the first stack and the second stack may be formed.

Subsequently, a sacrificial layer 73 is formed on the stack ST. The sacrificial layer 73 may include material having a high etch selectivity with respect to the second material layers 72. Thereafter, at least one separation insulating structure 74 that passes through the sacrificial layer 73 is formed. The separation insulating structure 74 may include a first separation insulating structure 74A formed in the memory block MB, and a second separation insulating structure 74B disposed on a boundary between memory blocks MB. The first separation insulating structure 74A may have a width less than that of the second separation insulating structure 74B. A plurality of first separation insulating structures 74A may be formed in each memory block MB. The memory block MB may be the unit for performing an erase operation and include a plurality of memory strings.

Figure 16B:
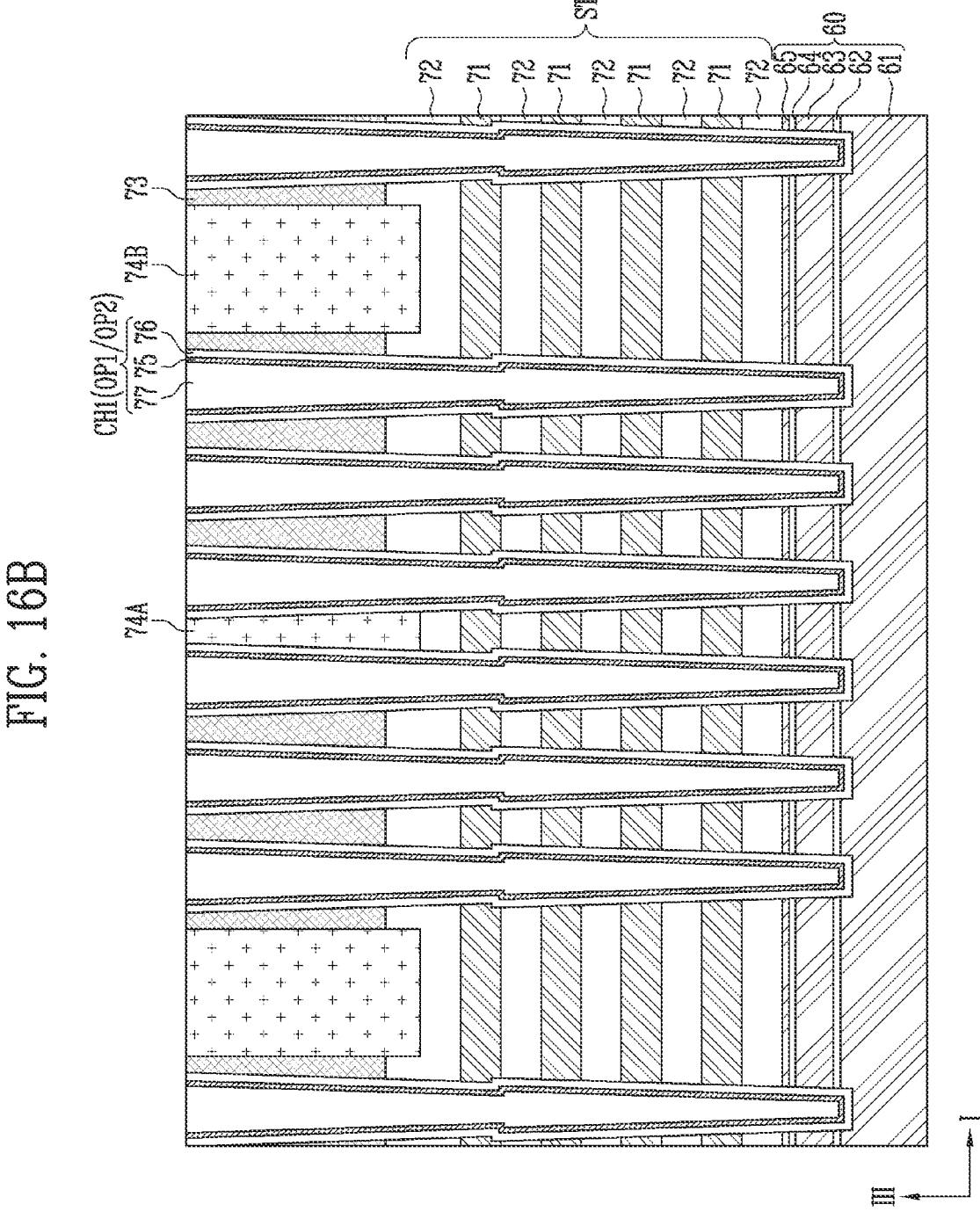

Referring to FIG. 16B, first channel structures CH1 are formed to pass through the sacrificial layer 73 and the stack ST. In an embodiment, second openings OP2 are formed to pass through the sacrificial layer 73 and the stack ST and expose the respective sacrificial pillars. Thereafter, after the sacrificial pillars are removed through the second openings OP2, the first channel structures CH1 are formed in the first and second openings OP1 and OP2. The first channel structures CH1 may overlap with the first separation insulating structures 74A. The first channel structures CH1 may be spaced apart from the second separation insulating structures 74B. Each of the first channel structures CH1 may include a first channel layer 75, a memory layer 76, and a first insulating core 77.

Figure 16C:
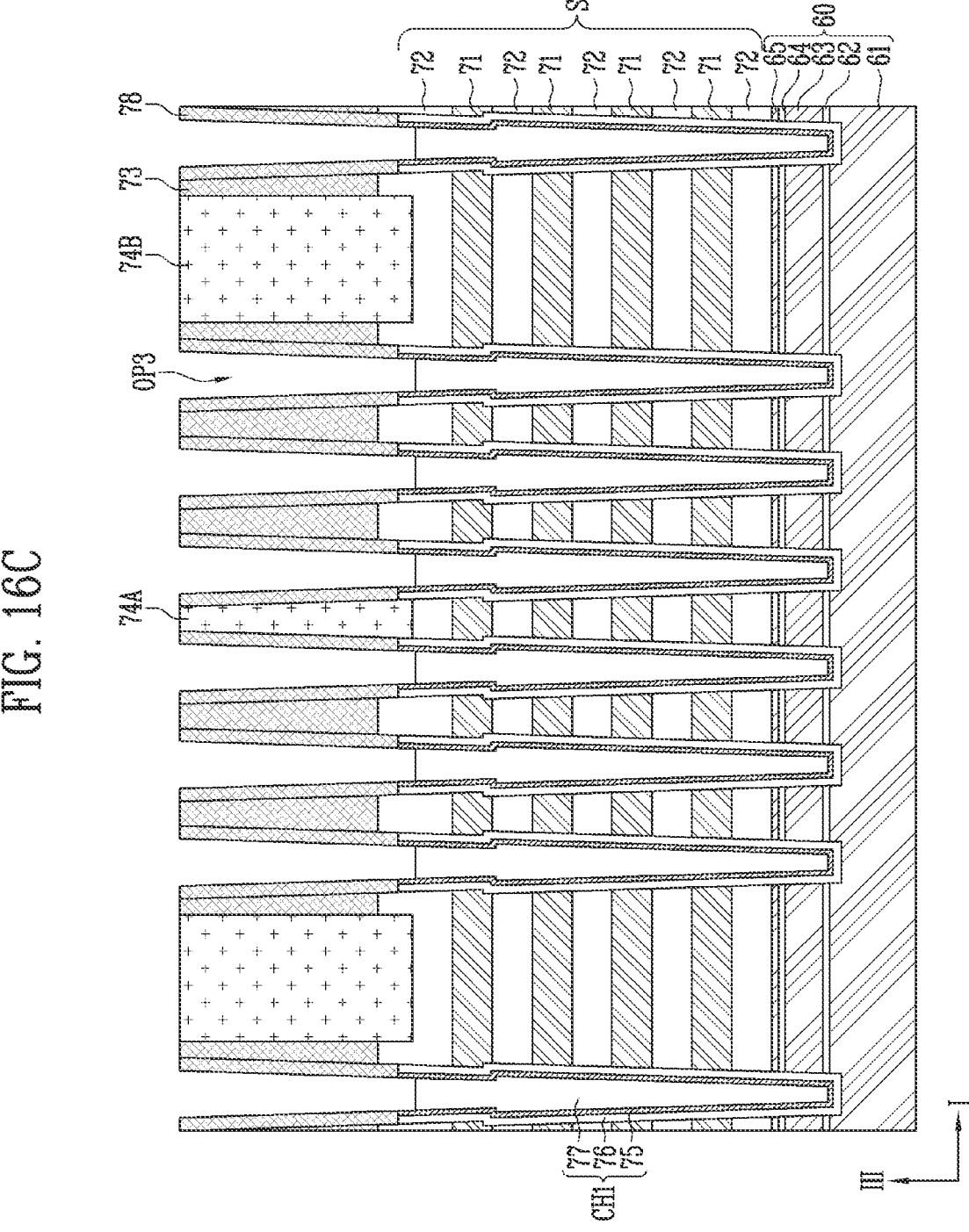

Referring to FIG. 16C, third openings OP3 are formed by etching the first channel structures CH1. Thereafter, sacrificial spacers 78 are formed in the third openings OP3. The sacrificial spacers 78 may be coupled with the sacrificial layer 73 and include substantially the same material as that of the sacrificial layer 73. When the sacrificial spacers 78 are formed, the first insulating core 77 may be partially etched.

Figure 16D:
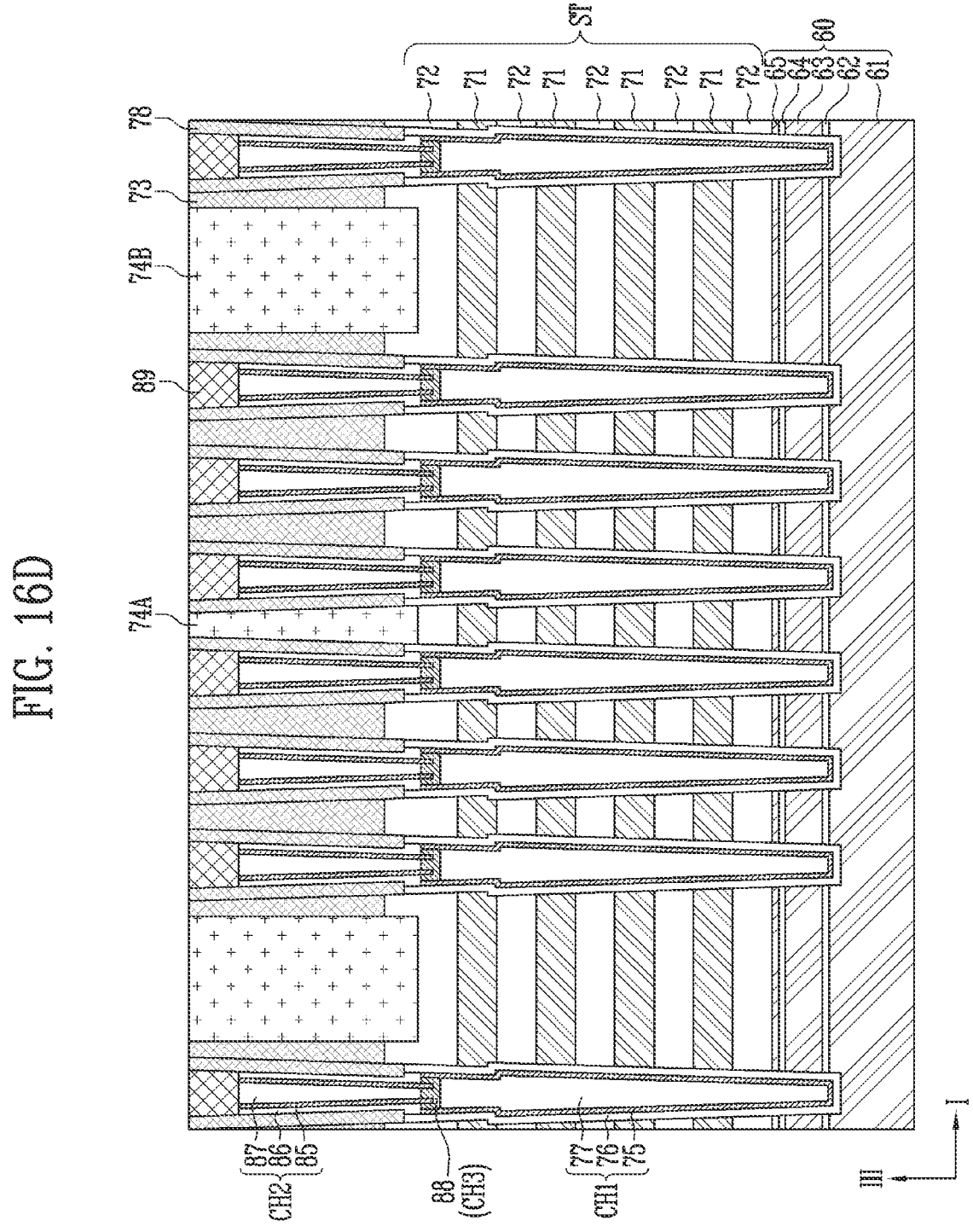

Referring to FIG. 16D, second channel structures CH2 are formed in the third openings OP3. After the first channel layers 75 are etched through the third openings OP3, respective gate insulating layers 86 are formed. Thereafter, second channel layers 85 are formed in the respective third openings OP3. Subsequently, the first insulating cores 77 are etched, and then third channel layers 88 are formed. The third channel structures CH3 each including the third channel layer 88 may be formed. Thereafter, second insulating cores 87 are formed in the respective third openings OP3. Eventually, the second channel structures CH2 each including the second channel layer 85, the gate insulating layer 86, and the second insulating core 87 may be formed. The first channel layers 75 and the second channel layers 85 are respectively coupled by the third channel layers 88. The third channel layers 88 may extend along the inner surfaces of the second channel layers 85 referring to the third channel layers 48 as shown in FIG. 10B. Thereafter, after the second channel structures CH2 are etched, contact pads 89 are formed.

Figure 16E:
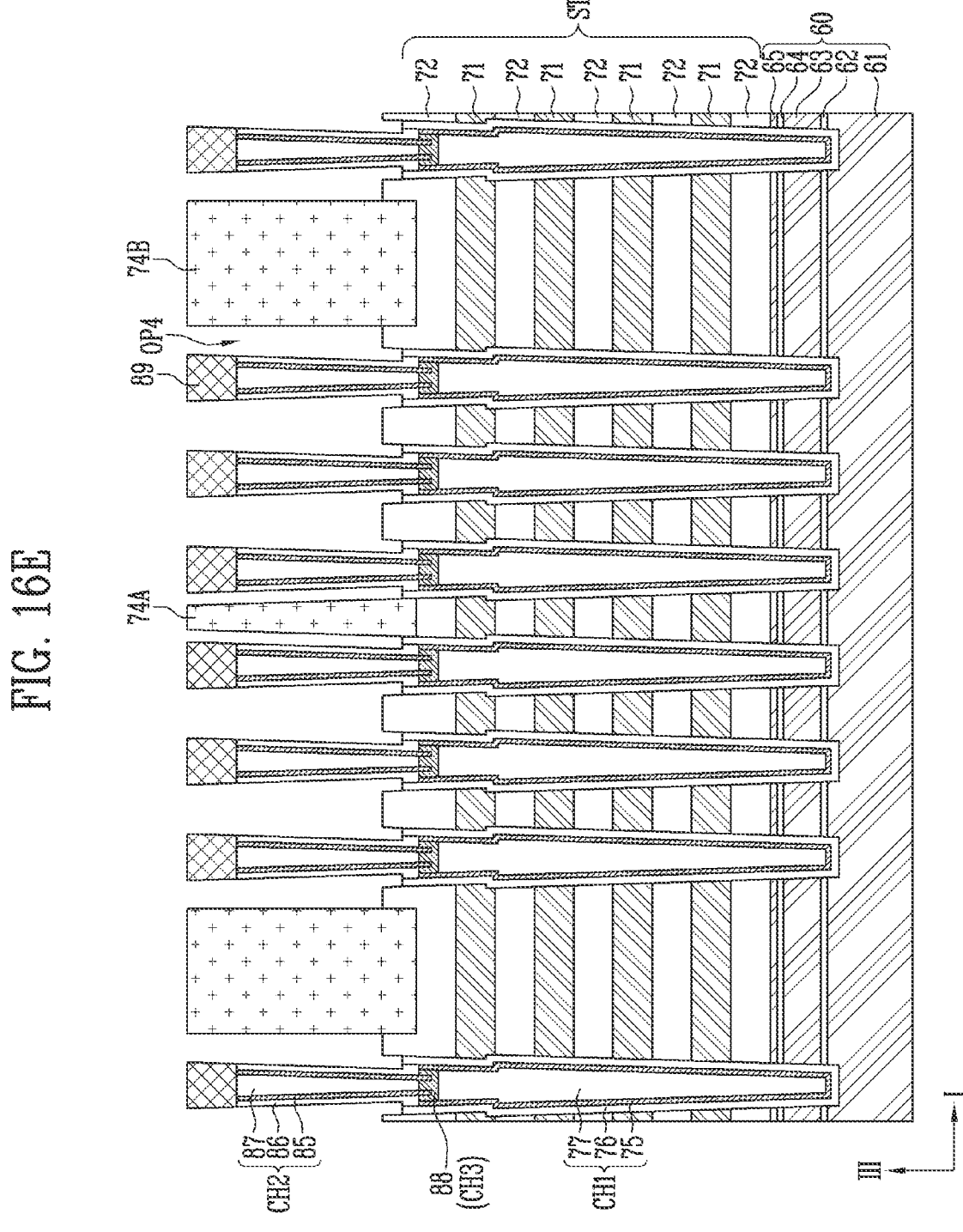

Referring to FIG. 16E, fourth openings OP4 are formed by removing the sacrificial layer 73 and the sacrificial spacers 78. The fourth openings OP4 may be separated from each other by the separation insulating structures 74A and 74B. The uppermost second material layer 72 and the second channel structures CH2 may be exposed through the fourth openings OP4.

Figure 16F:
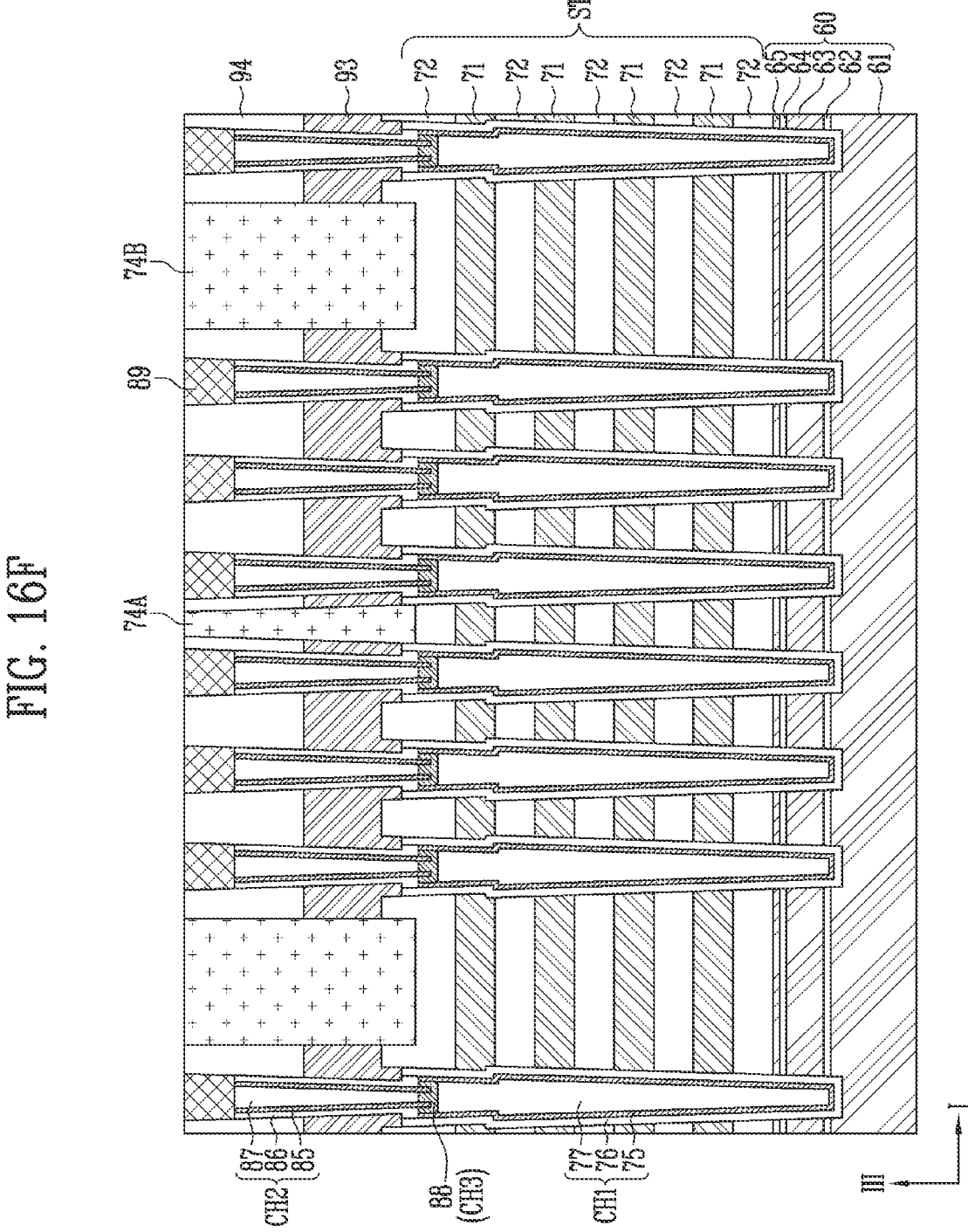

Referring to FIG. 16F, conductive layers 93 may be formed in the respective fourth openings OP4. The conductive layers 93 may be separated from each other by the separation insulating structures 74A and 74B. Thereafter, the conductive layers 93 are etched, and then insulating layers 94 may be formed.

Figure 16G:
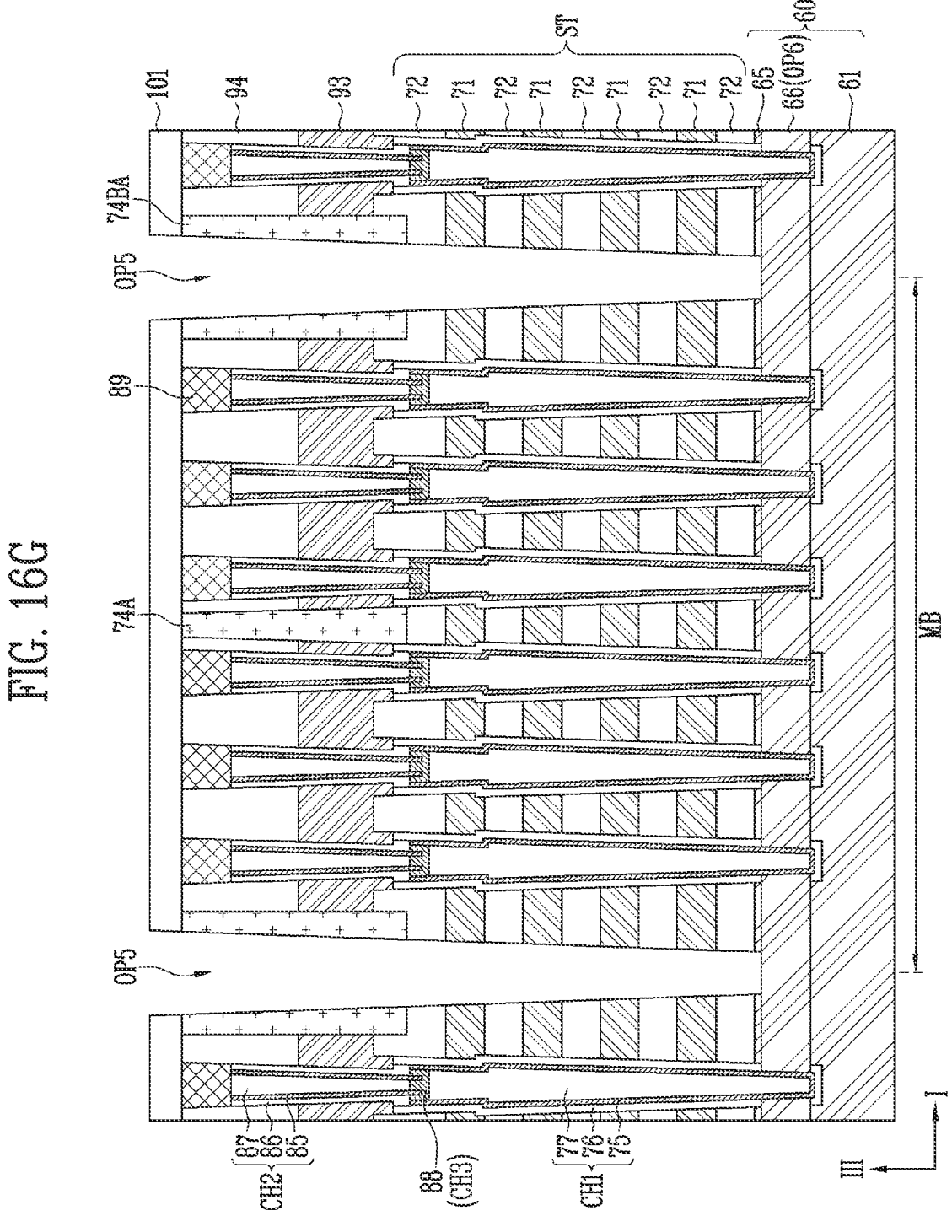

Referring to FIG. 16G, a capping layer 101 is formed on the insulating layers 94. The capping layer 101 may be formed to cover the contact pads 89. The capping layer 101 may include insulating material such as oxide or nitride.

Thereafter, a fifth opening OP5 is formed to expose the source structure 60. The fifth opening OP5 may be disposed on a boundary between the memory blocks MB. The fifth opening OP5 may pass through the capping layer 101, the second separation insulating structure 74B, and the stack ST. When the fifth opening OP5 is formed, the second separation insulating structure 74B may be etched, and a protective layer 74BA may be formed. The protective layer 74BA may prevent the conductive layer 93 from being exposed through the fifth opening OP5, and protect the conductive layer 93.

Thereafter, a sixth opening OP6 is formed by removing the first sacrificial layer 63 through the fifth opening OP5. Subsequently, the first channel layers 75 are exposed by etching the memory layers 76 exposed through the sixth opening OP6. When the memory layers 76 are etched, the second sacrificial layer 62 and the third sacrificial layer 64 may be etched along with the memory layers 76. Thereafter, a third source layer 66 is formed in the sixth opening OP6. The third source layer 66 may include conductive material such as polysilicon, tungsten, molybdenum, or metal. The third source layer 66 may be directly coupled with the first channel layers 75.

Figure 16H:
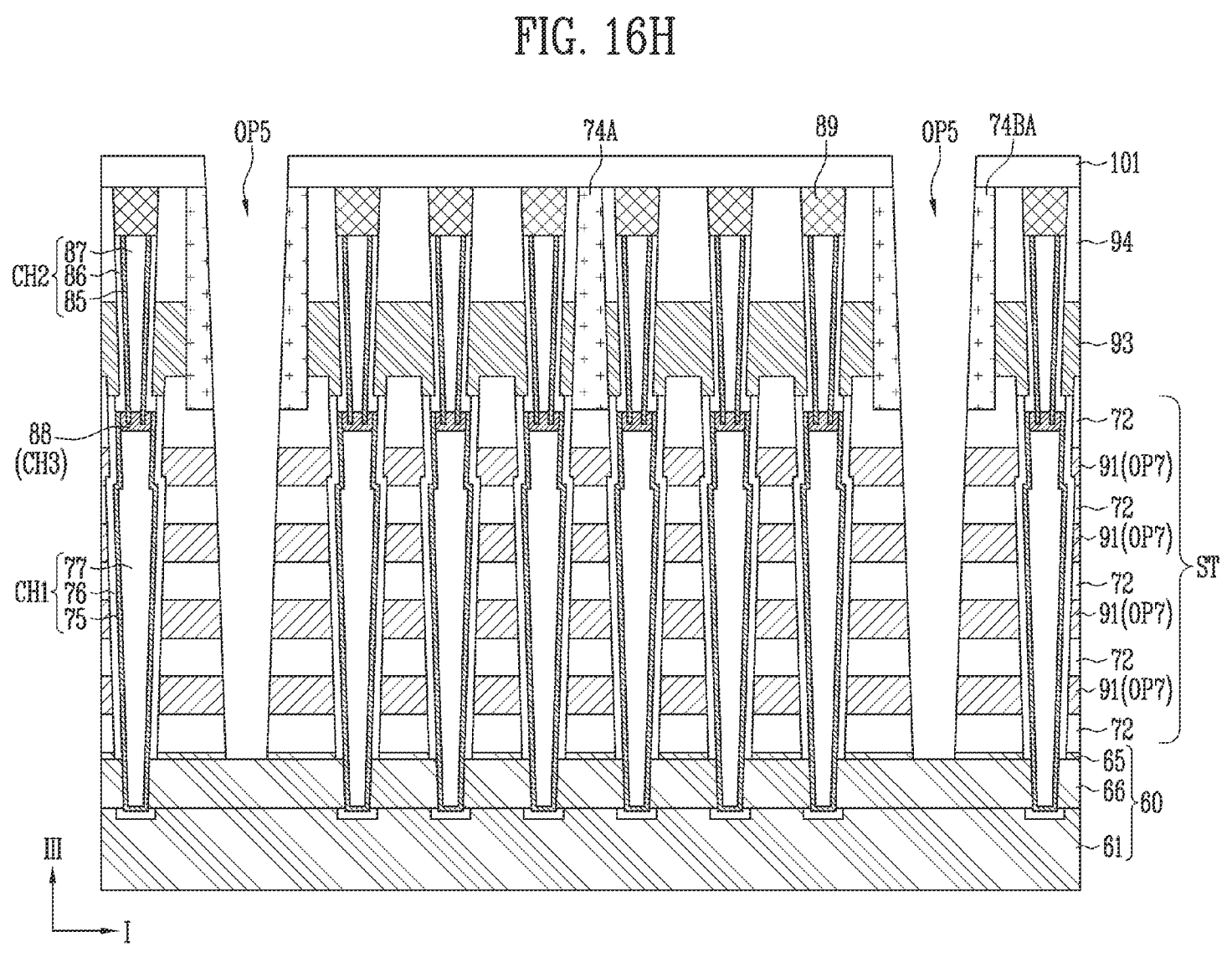

Referring to FIG. 16H, the first material layers 71 are replaced with the third material layers 91 through the fifth opening OP5. For example, in the case where the first material layers 71 include sacrificial material and the second material layers 72 include insulating material, the third material layers 91 may include conductive material such as polysilicon, tungsten, molybdenum, or metal. After seventh openings OP7 are formed by removing the first material layers 71 through the fifth opening OP5, third material layers 91 may be formed in the seventh openings OP7. Alternatively, in the case where the first material layers 71 include conductive material and the second material layers 72 include insulating material, the third material layers 91 including metal silicide material may be formed by silicidizing the first material layers 71.

Figure 16I:
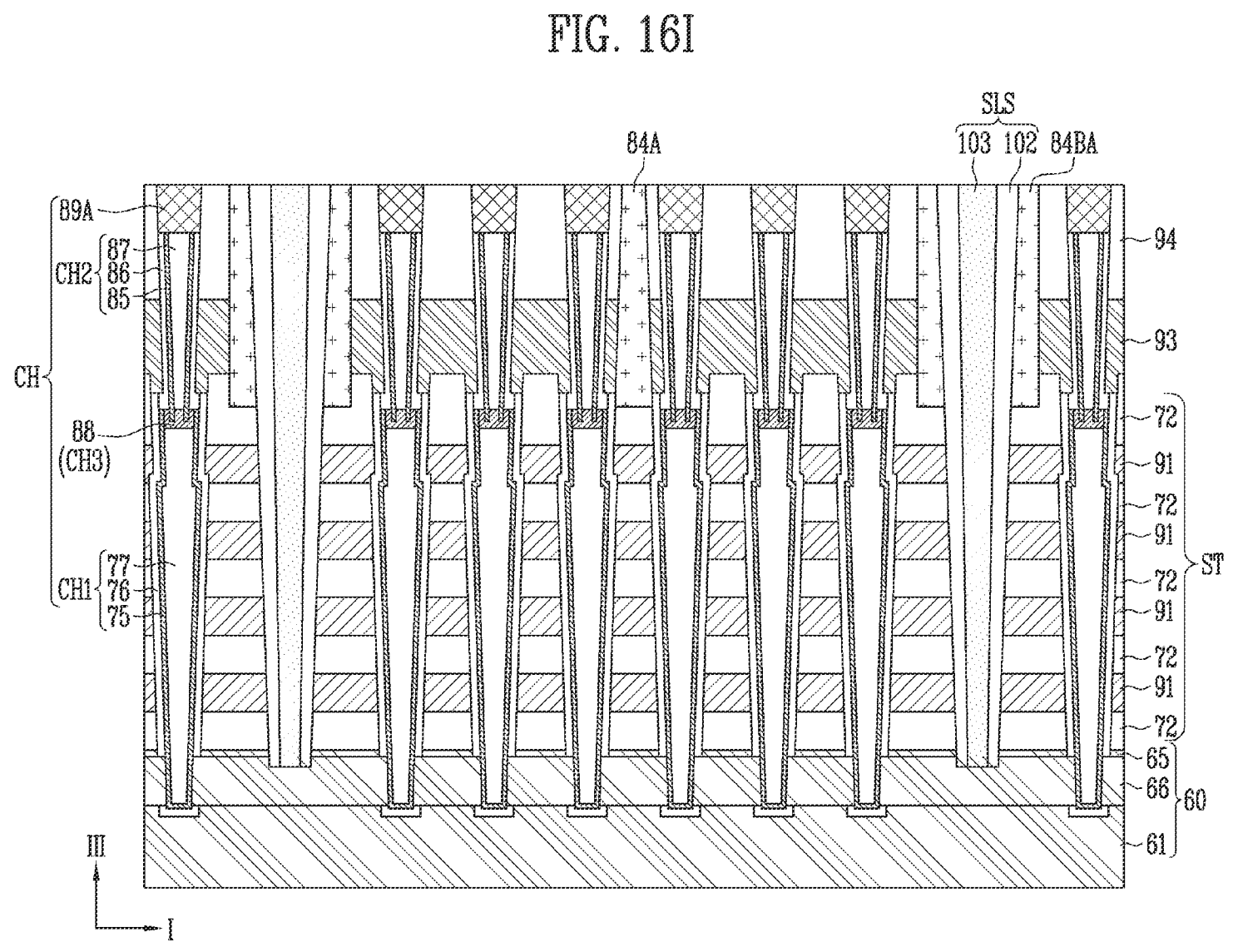

Referring to FIG. 16I, a slit structure SLS is formed in the fifth opening OP5. The slit structure SLS may include a source contact structure 103 and an insulating spacer 102. The insulating spacer 102 may be interposed between the source contact structure 103 and the first conductive layers 91. The insulating spacer 102 may include insulating material such as oxide, nitride, or air gap. The source contact structure 103 may be electrically coupled with the source structure 60. The source contact structure 103 may include conductive material such as polysilicon, tungsten, molybdenum, or metal. In an embodiment, after a source contact layer is formed in the fifth opening OP5 and on the capping layer 101, the source contact structure 103 may be formed by performing a planarization process until the insulating layer 94 is exposed.

Subsequently, impurities may be doped into the contact pads 89. The contact pads 89A doped with impurities may include junctions. Eventually, the channel structures CH each including a first channel structure CH1, a second channel structure CH2, a third channel structure CH3, and a contact pad 89A may be formed.

In accordance with the manufacturing method described above, the conductive layers 93 separated from each other by the separation insulating structure 84A may be formed.

Figure 17:
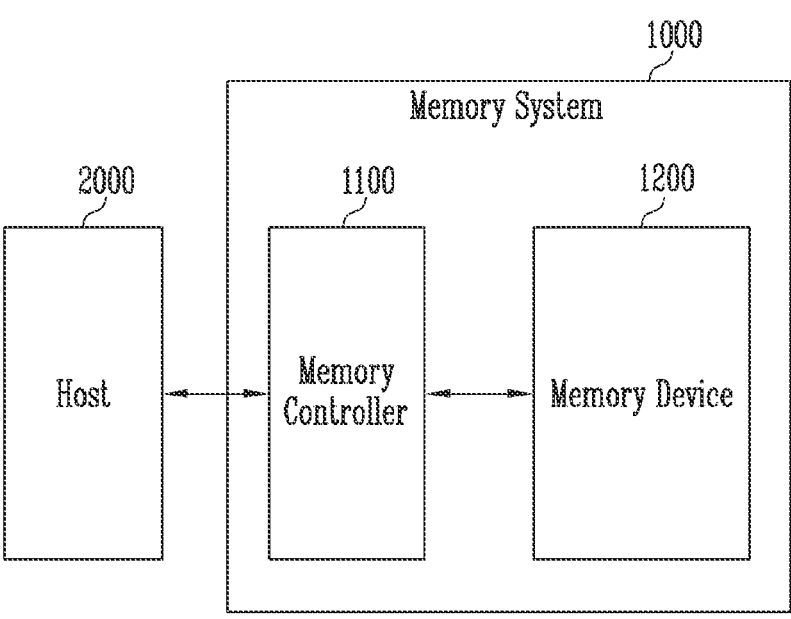
FIG. 17 is a diagram illustrating a memory system in accordance with an embodiment of the present disclosure.

FIG. 17 is a diagram illustrating a memory system 1000 in accordance with an embodiment of the present disclosure.

Referring to FIG. 17, the memory system 1000 may include a memory device 1200 configured to store data, and a controller 1100 configured to perform communication between the memory device 1200 and a host 2000.

The host 2000 may be a device or system configured to store data in the memory system 1000 or retrieve the data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 through various interfaces such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small disk interface (ESDI), and an integrated drive electronics (IDE) interface.

The host 2000 may include at least one of a computer, a portable digital device, a tablet PC, a digital camera, a digital audio player, a television, a wireless communication device, and a cellular phone, but embodiments of the present disclosure are not limited thereto.

The controller 1100 may control overall operations of the memory system 1000. The controller 1100 may control the memory device 1200 in response to a request from the host 2000. The controller 1100 may control the memory device 1200 to perform a program operation, a read operation, and an erase operation in response to a request from the host 2000. The controller 1100 may perform a background operation, etc. for improving in performance of the memory system 1000 even when there is no request from the host 2000.

The controller 1100 may transmit a control signal and a data signal to the memory device 1200 to control the operation of the memory device 1200. The control signal and the data signal may be transmitted to the memory device 1200 through different input/output lines. The data signal may include a command, an address, or data. The control signal may be used to separate a period in which a data signal is input, from other periods.

The memory device 1200 may perform, e.g., a program operation, a read operation, and an erase operation under control of the controller 1100. The memory device 1200 may be implemented as a volatile memory device in which data stored therein is lost when power is turned off, or a non-volatile memory device which can retain data stored therein even when power supply is interrupted. The memory device 1200 may be a semiconductor device having the structure described with reference to FIGS. 1 to 2C. The memory device 1200 may be a semiconductor device manufactured by the manufacturing method described with reference to FIGS. 3A to 16I. In an embodiment, the semiconductor device may include: a stack including first conductive layers and insulating layers which are alternately stacked; second conductive layers formed on the stack; a separation insulating structure disposed on the stack and configured to insulate the second conductive layers from each other; first channel layers passing through the stack; memory layers enclosing sidewalls of the first channel layers; second channel layers which are disposed on the stack and pass through the second conductive layers, and each of which has a width less than that of the first channel layers; gate insulating layers enclosing sidewalls of the second channel layers; and third channel layers configured to respectively couple the first channel layers with the second channel layers, and extending into the second channel layers.

Figure 18:
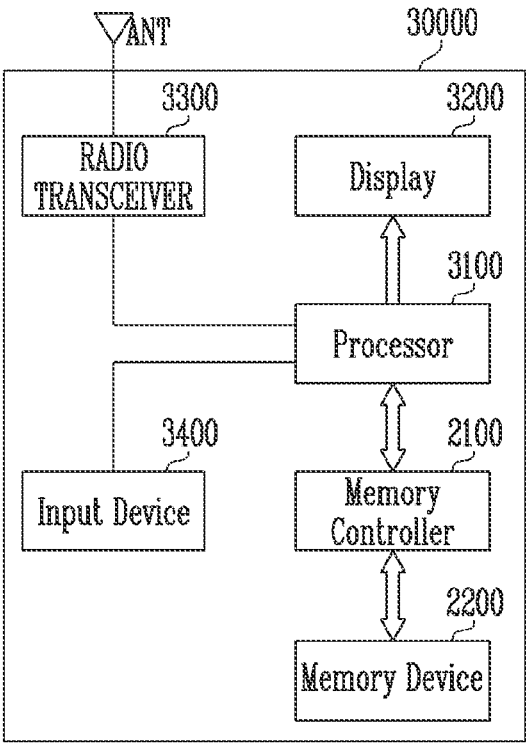
FIG. 18 is a diagram illustrating a memory system in accordance with an embodiment of the present disclosure.

FIG. 18 is a diagram illustrating a memory system 30000 in accordance with an embodiment of the present disclosure.

Referring to FIG. 18, the memory system 30000 may be embodied in a cellular phone, a smartphone, a tablet personal computer (PC), a personal digital assistant (PDA) or a wireless communication device. The memory system 30000 may include a memory device 2200 and a controller 2100 configured to control the operation of the memory device 2200.

The controller 2100 may control a data access operation, e.g., a program operation, an erase operation, or a read operation, of the memory device 2200 under control of a processor 3100.

Data programmed to the memory device 2200 may be output through a display 3200 under control of the controller 2100.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal outputted from the radio transceiver 3300 and transmit the processed signal to the controller 2100 or the display 3200. The controller 2100 may transmit a signal processed by the processor 3100 to the memory device 2200. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data output from the controller 2100, data output from the radio transceiver 3300, or data output form the input device 3400 is output through the display 3200.

In an embodiment, the controller 2100 capable of controlling the operation of the memory device 2200 may be implemented as a part of the processor 3100 or a chip provided separately from the processor 3100.

Figure 19:
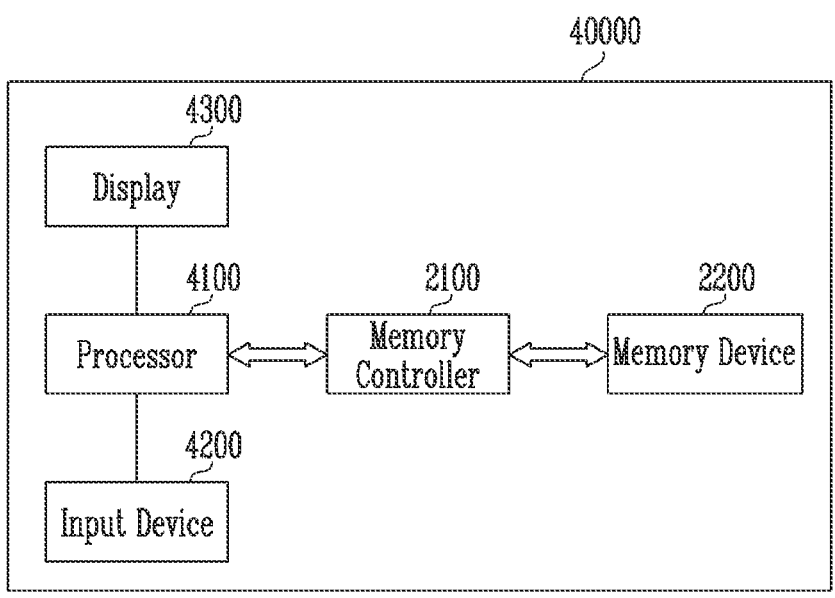
FIG. 19 is a diagram illustrating a memory system in accordance with an embodiment of the present disclosure.

FIG. 19 is a diagram illustrating a memory system 40000 in accordance with an embodiment of the present disclosure.

Referring to FIG. 19, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 2200, and a controller 2100 configured to control a data processing operation of the memory device 2200.

A processor 4100 may output data stored in the memory device 2200 through a display 4300, according to data input from an input device 4200. For example, the input device 4200 may be embodied in a pointing device such as a touch pad or a computer mouse, a keypad, or a keyboard.

The processor 4100 may control the overall operation of the memory system 40000 and control the operation of the controller 2100. In an embodiment, the controller 2100 capable of controlling the operation of the memory device 2200 may be embodied as a part of the processor 4100 or a chip provided separately from the processor 4100.

Figure 20:
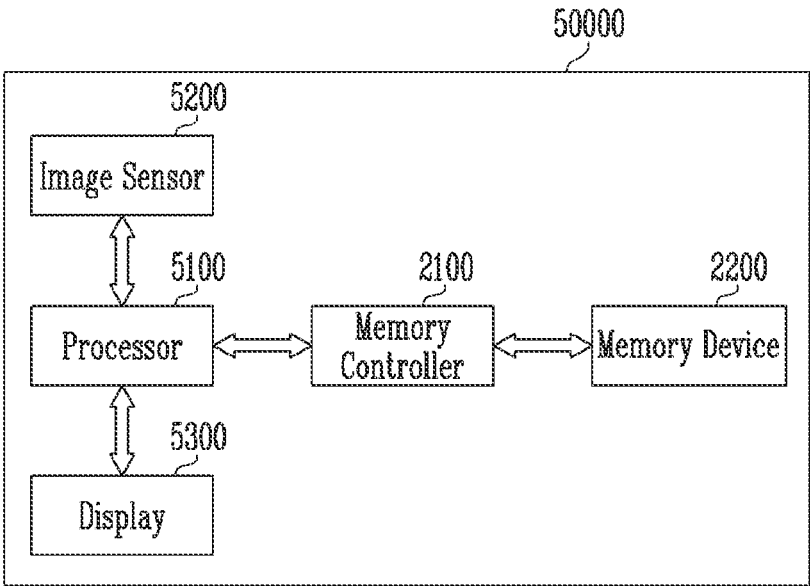
FIG. 20 is a diagram illustrating a memory system in accordance with an embodiment of the present disclosure.

FIG. 20 is a diagram illustrating a memory system 50000 in accordance with an embodiment of the present disclosure.

Referring to FIG. 20, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 2200, and a controller 2100 configured to control a data processing operation, e.g., a program operation, an erase operation, or a read operation, of the memory device 2200.

An image sensor 5200 of the memory system 50000 may convert an optical image into digital signals. The converted digital signals may be transmitted to a processor 5100 or the controller 2100. Under control of the processor 5100, the converted digital signals may be outputted through a display 5300 or stored in the memory device 2200 through the controller 2100. Data stored in the memory device 2200 may be output through the display 5300 under control of the processor 5100 or the controller 2100.

In an embodiment, the controller 2100 capable of controlling the operation of the memory device 2200 may be implemented as a part of the processor 5100 or a chip provided separately from the processor 5100.

Figure 21:
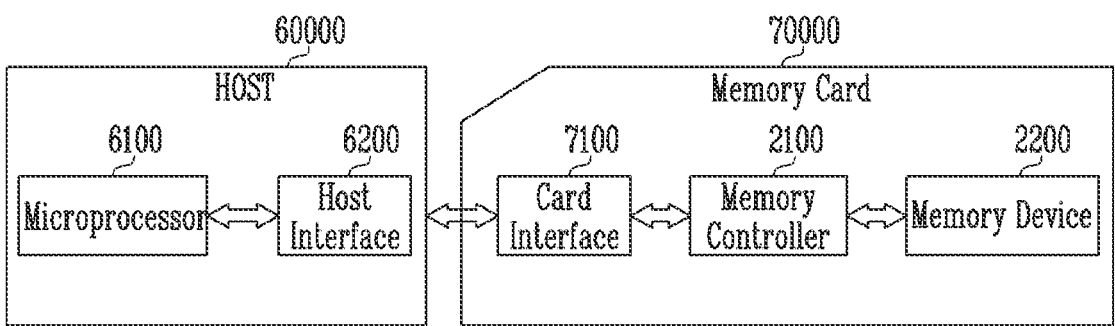
FIG. 21 is a diagram illustrating a memory system in accordance with an embodiment of the present disclosure.

FIG. 21 is a diagram illustrating a memory system 70000 in accordance with an embodiment of the present disclosure.

Referring to FIG. 21, the memory system 70000 may be embodied in a memory card or a smart card. The memory system 70000 may include a memory device 2200, a controller 2100, and a card interface 7100.

The controller 2100 may control data exchange between the memory device 2200 and the card interface 7100. In an embodiment, the card interface 7100 may be a secure digital (SD) card interface or a multi-media card (MMC) interface, but the present disclosure is not limited thereto.

The card interface 7100 may interface data exchange between a host 60000 and the controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 2200 through the card interface 7100 and the controller 2100 under control of a microprocessor 6100.

Various embodiments of the present disclosure may provide a semiconductor device having a stable structure and improved reliability. Furthermore, in manufacturing the semiconductor device, the manufacturing process may be simplified, and the manufacturing cost may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a stack including first conductive layers and insulating layers that are alternately stacked;
second conductive layers disposed on the stack;
a separation insulating structure disposed on the stack and laterally separating the second conductive layers to insulate the second conductive layers from each other;
first channel layers passing through the stack;
memory layers extending vertically along the first channel layers;
second channel layers disposed on the stack and passing through the second conductive layers, and each having a width less than a width of the first channel layers;
gate insulating layers extending vertically along the second channel layers and extending to sidewalls of the memory layers to be in physical contact with the sidewalls of the memory layers; and
third channel layers configured to respectively couple the first channel layers with the second channel layers and extending into the second channel layers,
wherein at least a portion of each of the second conductive layers overlaps at least a portion of each of the first channel layers, and
wherein at least a portion of an outer side surface of each of the second channel layers is in contact with the corresponding third channel layer.

2. The semiconductor device according to claim 1, wherein the memory layers contact with the second conductive layers.

3. The semiconductor device according to claim 1, wherein each of the gate insulating layers comprises:
a first portion interposed between the second channel layers and the memory layers and being in contact with the sidewalls of the memory layers; and
a second portion interposed between the second channel layers and the second conductive layers,
wherein the first portion protrudes farther toward one of the memory layers than the second portion.

4. The semiconductor device according to claim 3, wherein the first portion has a width greater than a width of the second portion.

5. The semiconductor device according to claim 1, wherein each of the third channel layers comprises:
a first portion in contact with the corresponding first channel layer; and
a second portion in contact with the corresponding second channel layer.

6. The semiconductor device according to claim 1, wherein the third channel layers extends between outer surfaces of the second channel layers and inner surfaces of the first channel layers.

7. The semiconductor device according to claim 5, wherein the first portion has a width greater than a width of the second portion.

8. The semiconductor device according to claim 5, wherein an upper surface of the second portion of each of the third channel layers and an upper surface of the corresponding second channel layer are disposed substantially on a same plane.

9. The semiconductor device according to claim 1, wherein each of the second conductive layers comprises:
a first portion disposed on the stack; and
second portions respectively surrounding the second channel layers and protruding into the stack toward the first channel layers.

10. The semiconductor device according to claim 9, wherein the second portions contact with the memory layers.

11. The semiconductor device according to claim 9, wherein an outer wall of each of the second portions is aligned with an outer wall of the corresponding memory layer.

12. The semiconductor device according to claim 1, wherein at least a portion of at least one of the second channel layers is disposed at the same level as at least one of the first channel layers and at least one of the third channel layers.

13. The semiconductor device according to claim 12, wherein the at least one of the second channel layers is in contact with the at least one of the third channel layers, and
wherein the at least one of the second channel layers is not in contact with the at least one of the first channel layers.

14. The semiconductor device according to claim 12, wherein the at least one of the first channel layers is in contact with the at least one of the third channel layers.

15. A semiconductor device comprising:
a stack including word lines and insulating layers that are alternately stacked;
first channel layers passing through the stack;
memory layers extending vertically along the first channel layers;
second channel layers disposed on the stack;
gate insulating layers extending vertically along the second channel layers;
third channel layers configured to respectively couple the first channel layers with the second channel layers;

select lines each comprising a first portion disposed on the stack, and second portions respectively enclosing the second channel layers and protruding into the stack toward the first channel layers; and a separation insulating structure disposed on the stack and laterally separating the select lines to insulate the select lines from each other, wherein at least a portion of each of the second portions overlaps at least a portion of each of the first channel layers, wherein the gate insulating layers extend to sidewalls of the memory layers to be in physical contact with the sidewalls of the memory layers, wherein at least a portion of an outer side surface of each of the second channel layers is in contact with the corresponding third channel layer, and wherein at least a portion of at least one of the second channel layers is disposed at the same level as at least one of the first channel layers and at least one of the third channel layers.

16. The semiconductor device according to claim 15, wherein the second portions of the select lines contact with the memory layers.

17. The semiconductor device according to claim 15, wherein an outer wall of each of the second portions is aligned with an outer wall of the corresponding memory layer.

18. The semiconductor device according to claim 15, wherein each of the second channel layers has a width less than a width of each of the first channel layers.

19. The semiconductor device according to claim 15, wherein each of the gate insulating layers comprises:

a first portion interposed between the second channel layers and the memory layers and being in contact with the sidewalls of the memory layers; and a second portion interposed between the second channel layers and the select lines, wherein the first portion protrudes farther toward one of the memory layers than the second portion.

20. The semiconductor device according to claim 19, wherein the first portion of each of the gate insulating layers has a width greater than a width of the second portion.

21. The semiconductor device according to claim 15, wherein each of the third channel layers comprises:

a first portion in contact with the corresponding first channel layer; and a second portion extending into the corresponding second channel layer.

22. The semiconductor device according to claim 21, wherein the first portion of each of the third channel layers has a width greater than a width of the second portion.

23. The semiconductor device according to claim 21, wherein an upper surface of the second portion of each of the third channel layers and an upper surface of the corresponding second channel layer are disposed substantially on a same plane.

24. The semiconductor device according to claim 15, wherein the at least one of the second channel layers is in contact with the at least one of the third channel layers, and wherein the at least one of the second channel layers is not in contact with the at least one of the first channel layers.

25. The semiconductor device according to claim 15, wherein the at least one of the first channel layers is in contact with the at least one of the third channel layers.

* * * * *